(12) United States Patent
Krafcik et al.

(10) Patent No.: US 6,465,951 B1
(45) Date of Patent: Oct. 15, 2002

(54) ELECTROLUMINESCENT LAMP DEVICES AND THEIR MANUFACTURE

(75) Inventors: Robert J. Krafcik, Phoenix, AZ (US); Douglas T. Wheeler, New York, NY (US); Walter J. Paciorek; Ralph McGuigan, both of Phoenix, AZ (US); Rodney T. Eckersley, Tempe, AZ (US); Dee Lynn Johnson, Woodbury; Harold T. Munson, North Oakdale, both of MN (US)

(73) Assignee: Durel Corporation, Chandler, AZ (US)

( * ) Notice: Subject to any disclaimer, the term of this patent is extended or adjusted under 35 U.S.C. 154(b) by 0 days.

(21) Appl. No.: 09/563,546

(22) Filed: May 1, 2000

Related U.S. Application Data

(63) Continuation-in-part of application No. 09/028,622, filed on Feb. 24, 1998, now Pat. No. 6,069,444, which is a continuation-in-part of application No. 08/731,519, filed on Oct. 15, 1996, now Pat. No. 5,811,930, which is a continuation-in-part of application No. 08/407,269, filed on Mar. 20, 1995, now Pat. No. 5,565,733, and a continuation-in-part of application No. 07/991,295, filed on Dec. 16, 1992.

(51) Int. Cl.[7] .............................. H01J 1/62; H01J 63/04
(52) U.S. Cl. ...................... 313/512; 313/502; 313/503; 313/506; 313/509; 445/52; 445/22
(58) Field of Search ................................. 313/506, 510, 313/511, 512, 513, 515; 445/22, 23, 24, 52; 427/66; 40/541, 542, 544

(56) References Cited

U.S. PATENT DOCUMENTS 3,839,129 A * 10/1974 Neumann .................... 264/1.9
4,159,559 A * 7/1979 Robinson, Sr. ............... 445/35
4,647,337 A * 3/1987 Simopoulos et al. ........ 156/633
5,780,965 A * 7/1998 Cass et al. .................... 313/512

FOREIGN PATENT DOCUMENTS

| DE | 4121151 A1 | * | 1/1993 | ............ H01J/31/50 |
| DE | 29604910 U1 | * | 7/1996 | ........... B29C/45/14 |
| EP | 629486 A2 | * | 12/1994 | ........... B29C/51/42 |
| FR | 0917409 A1 | * | 11/1997 | .................. 313/512 |
| JP | 406283265 A | * | 10/1994 | .................. 313/512 |
| WO | WO 9849871 A1 | * | 11/1998 | ........... H05B/33/02 |

* cited by examiner

Primary Examiner—Ashok Patel
Assistant Examiner—Mariceli Santiago
(74) Attorney, Agent, or Firm—Fish & Richardson P.C.

(57) ABSTRACT

A method for forming an electroluminescent lamp unit. A multi-layer sheet form electroluminescent lamp, the multi-layer sheet form lamp includes a pair of sheet-form conductive layers, one of which is transparent for transmitting light emitted from the particles, an electroluminescent sheet-form layer disposed between the pair of sheet-form conductive layers and having electroluminescent particles, and a carrier substrate for supporting the pair of sheet-form conductive layers and electroluminescent sheet-form layer. The multi-layer sheet form lamp is heated at a temperature sufficient for maintaining the operational integrity of said carrier substrate and said thermoplastic layers. The multi-layer sheet form lamp is them formed into a desired three-dimensional shape.

32 Claims, 23 Drawing Sheets

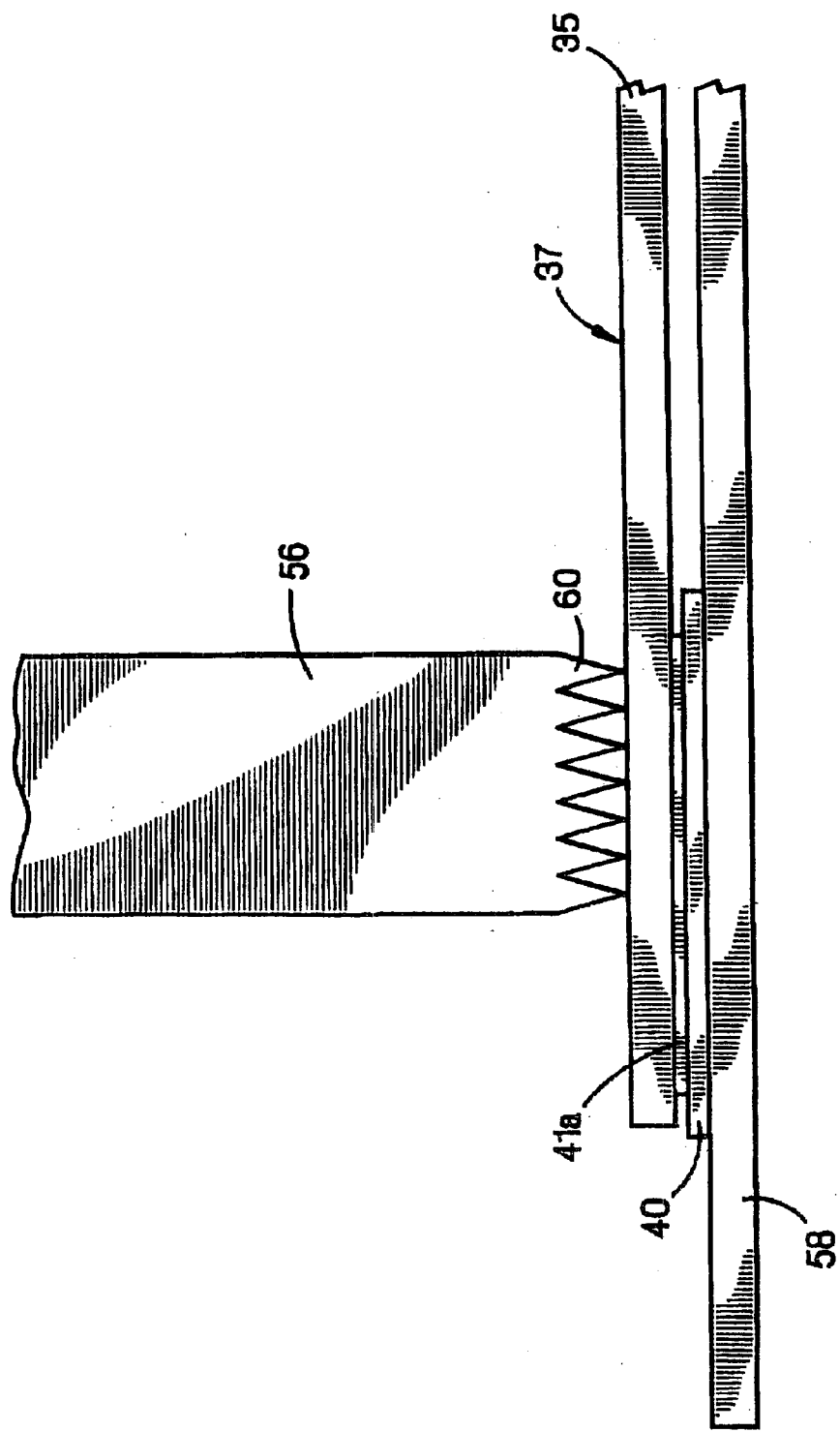

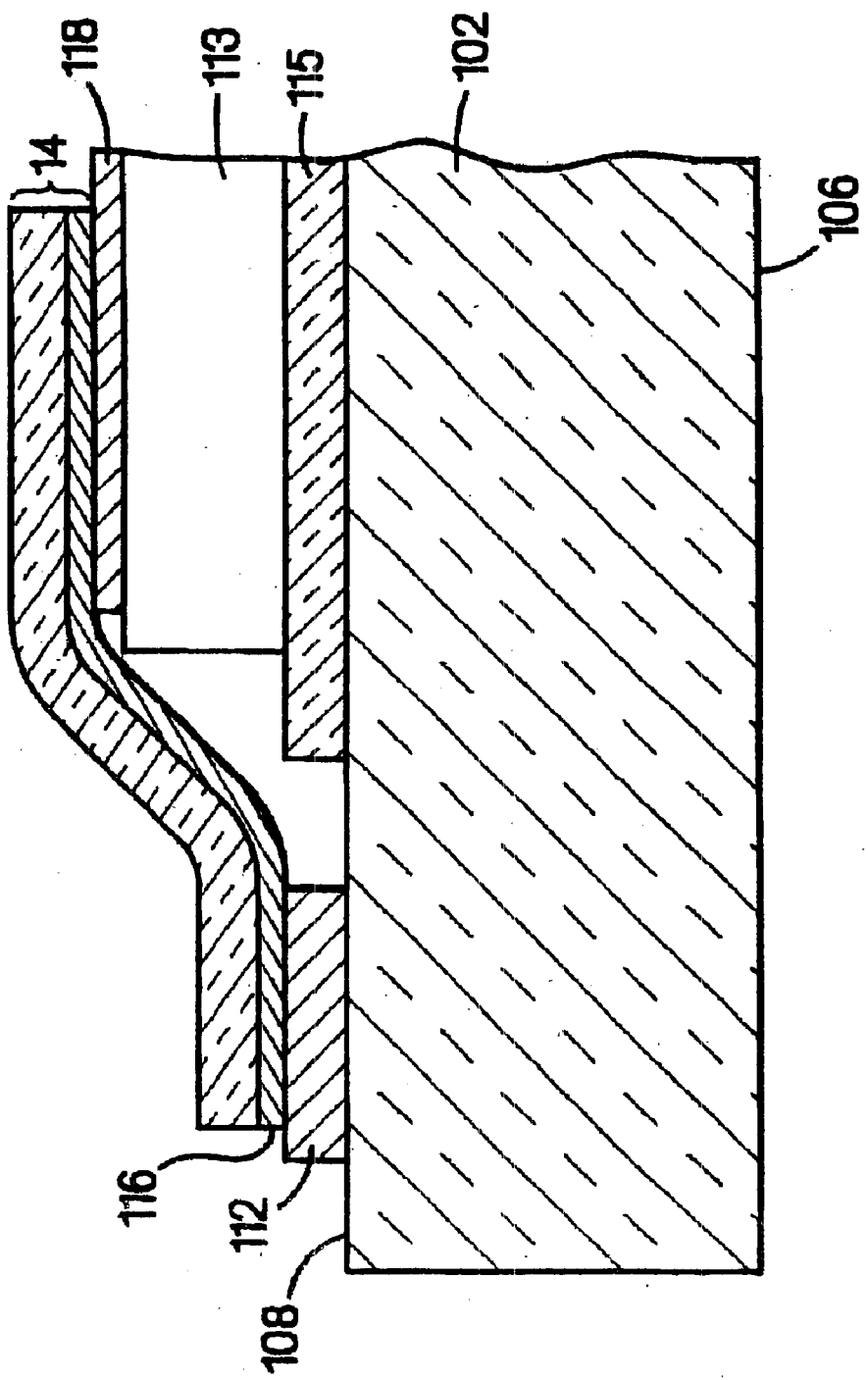

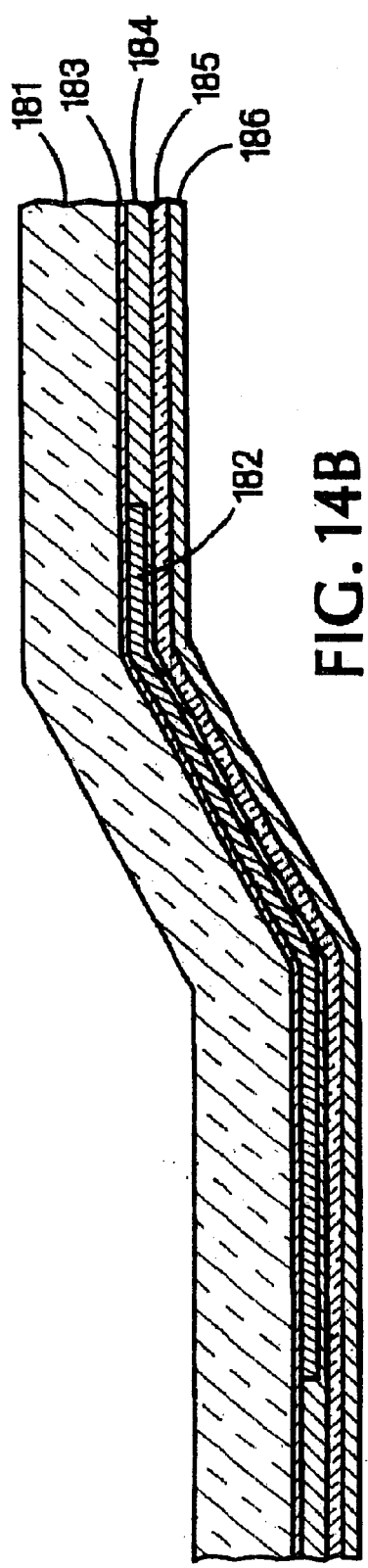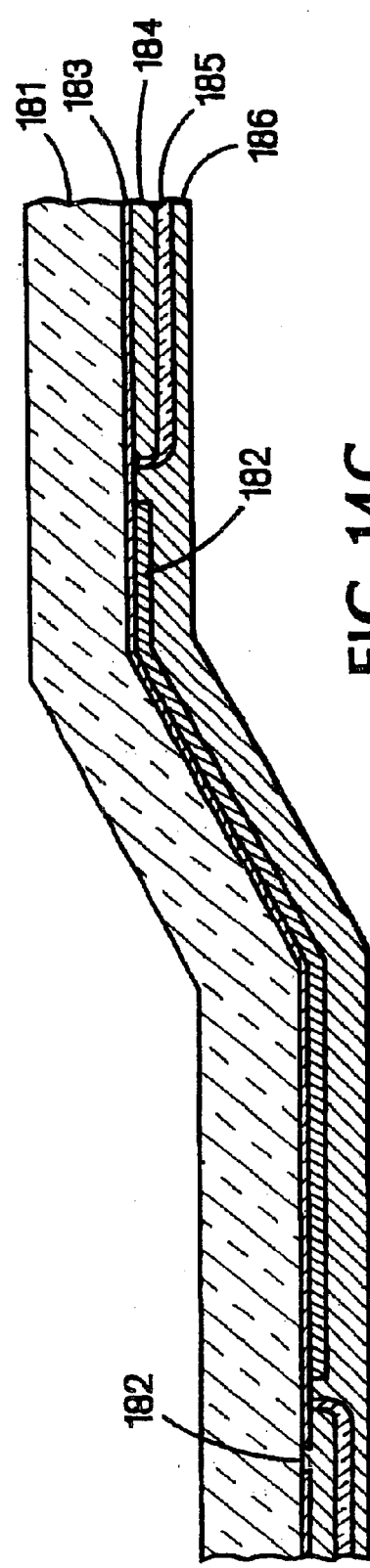

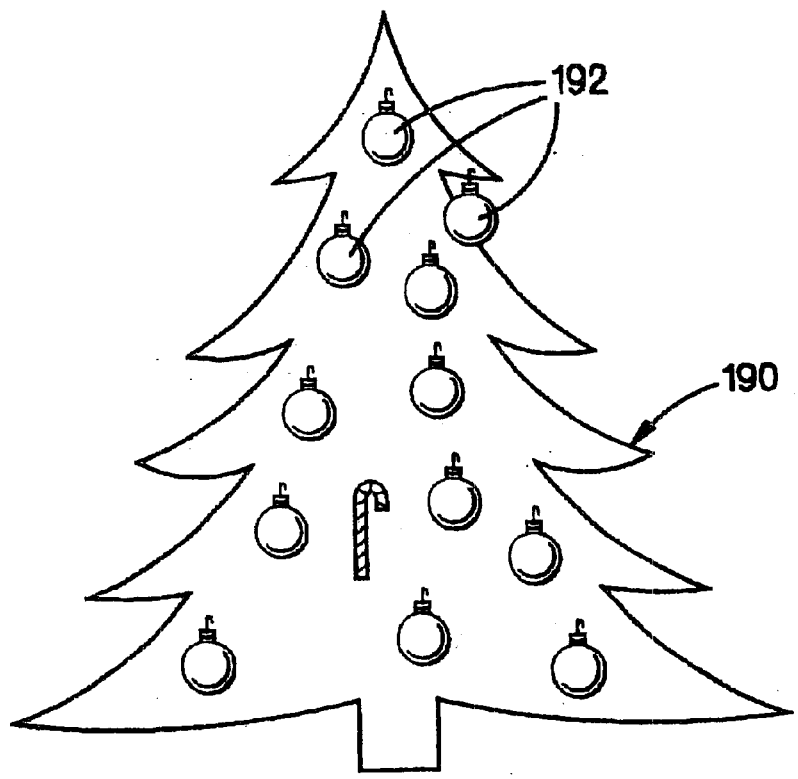
FIG. 15A
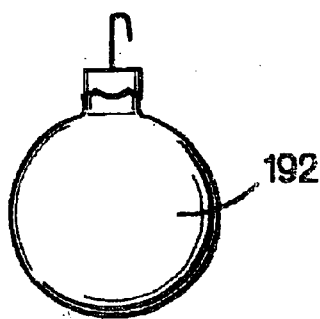
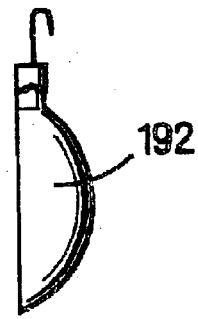
FIG. 15B     FIG. 15C     FIG. 15D

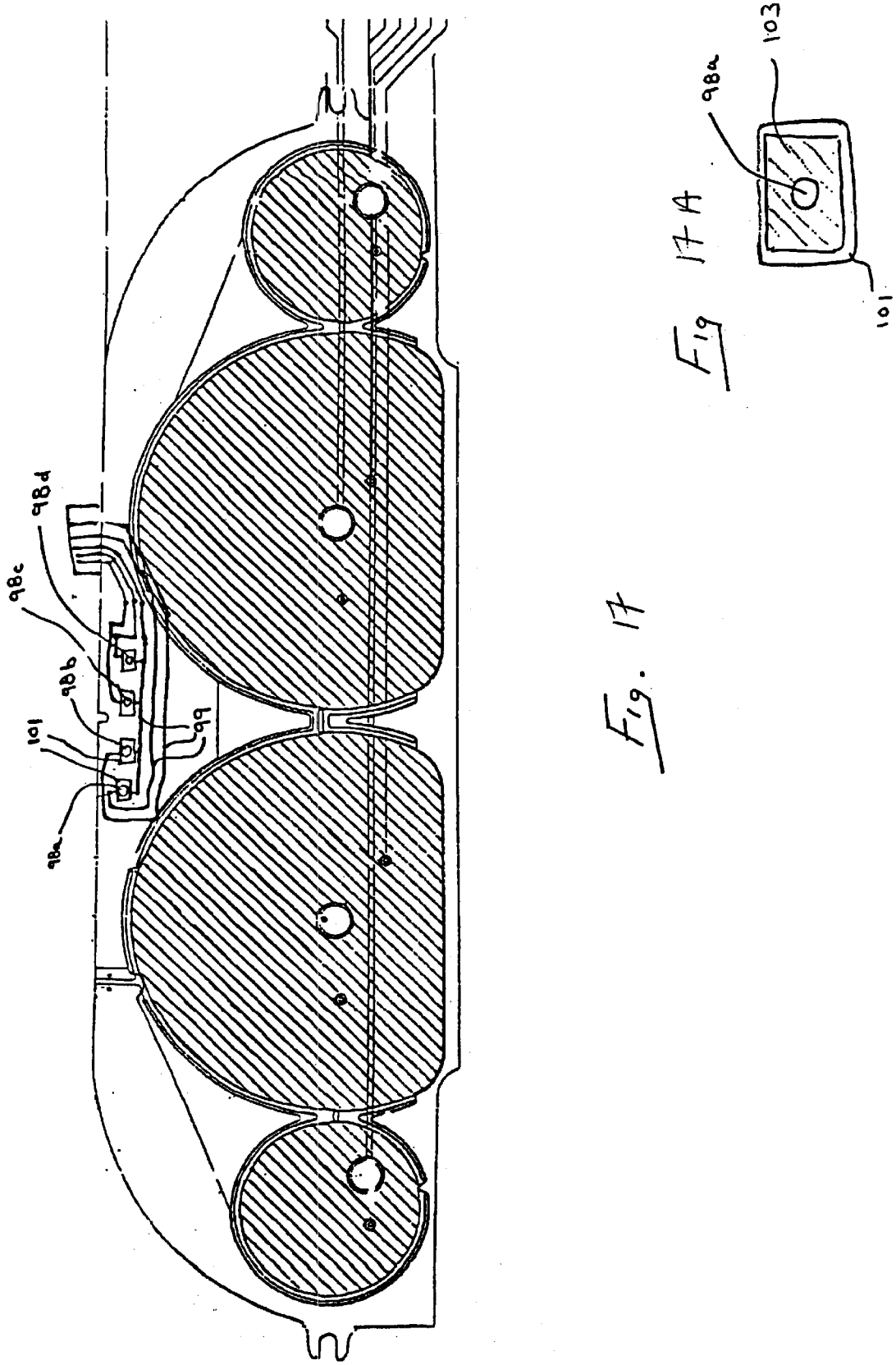

ELECTROLUMINESCENT LAMP DEVICES AND THEIR MANUFACTURE

CROSS REFERENCE TO RELATED APPLICATIONS

This application is a continuation in-part of application Ser. No. 09/028,622, filed Feb. 24, 1998, now U.S. Pat. No. 6,069,444, which is a continuation-in-part of application Ser. No. 08/731,519 filed Oct. 15, 1996, now U.S. Pat. No. 5,811,930, which is a continuation of application Ser. No. 08/407,269 filed Mar. 20, 1995 which issued as U.S. Pat. No. 5,565,733 and is a continuation of application Ser. No. 07/991,295 filed Dec. 16, 1992.

TECHNICAL FIELD OF THE INVENTION

This invention relates to the achievement of low cost and versatile electroluminescent lamp products.

As is known by those in the art, an electroluminescent lamp is a surface-area light source consisting of a suitable phosphor placed between electrodes, one of which is essentially transparent. When an alternating current is applied between the electrodes the phosphor emits light, the color of the light dependent on the choice of phosphor.

Such lamps are suitable for a wide variety of applications, including illuminated instrument panels, dial indicators, signs and the like. Such electroluminescent lamp panels can be fabricated by applying a general coating of conductive material, such as indium tin oxide, over the entire substrate panel, the coating providing the material for one of the electrodes, upon which the phosphor and rear electrode layers are applied. In many applications, the full surface of the panel is not required to be light emitting and the unlit portion is masked by printing an opaque ink on the front surface of the lamp. Alternatively, as described in U.S. Pat. No. 4,904,901, material (indium tin oxide) corresponding to the transparent layer is deposited over an entire surface of the panel and is thereafter removed from most of the surface with an acid etch leaving behind areas corresponding to discrete areas of illumination. The phosphor and rear electrode layers are then deposited over the discrete areas. Likewise, either the phosphor or the rear electrode can be applied over desired areas using techniques well known in the art.

SUMMARY OF THE INVENTION

According to the invention, for forming a modular lamp unit, flat-form flexible electroluminescent lamps of selected limited size are placed and secured upon a larger printed circuit substrate employing surface mount techniques. The substrate and secured lamps can be subsequently deformed into a desired shape or incorporated as is into a product. Alternatively, the lamp and the substrate may be subject to separate preforming operations and can then be joined together. In all these cases, the area occupied by the lamp is restricted solely to the area desired to be illuminated. Thus, the invention reduces production cost by significantly reducing the area covered by the lamp. As is known in the art, conductive materials (e.g. indium tin oxide) used to provide an electrode of the lamp can be relatively expensive. Further, smaller segmented and individually addressable lamps consume less electrical power, generate less heat and are more reliable than large full area lamps having opaque patterns over unlit portions of the lamp. Opaque patterns for covering lit line traces between desired areas of illumination are also eliminated. Automation of the process for placing and securing individual lamps is preferably achieved by programmed pick and place robots for selecting and placing the lamp on the surface of a receiving printed circuit substrate according to pre-specified instructions, followed by automated steps to connect and secure the lamps to the substrate.

Shaping the lamps and substrate permits their use in a wide variety of applications, e.g., to accommodate special aesthetic designs or where space is limited. In addition, the flexible nature of the lamps and use of a flexible substrate permit their use in applications where the flexible substrate is actuated, such as in the opening and closing of a cassette player door. Novel thermalforming techniques enable molding of a preformed lamp member into a stable desired three-dimension shape without impairing the function of the lamp.

The invention also permits a number of lamps to be provided onto a printed circuit substrate, each lamp or separate groups being independently addressable and having different colors or brightness characteristics. Individually addressable lamps of the unit may be individually driven or may be powered by a single power supply.

In one aspect of the invention a method for forming an electroluminescent lamp includes the following steps. A multi-layer sheet form electroluminescent lamp is provided. The multi-layer sheet form lamp includes a pair of sheet-form conductive layers, one of which is transparent for transmitting light emitted from the particles, an electroluminescent sheet-form layer disposed between the pair of sheet-form conductive layers and having electroluminescent particles, and a carrier substrate for supporting the pair of sheet-form conductive layers and electroluminescent sheet-form layer. The multi-layer sheet form lamp is heated at a temperature sufficient for maintaining the operational integrity of the carrier substrate and the thermoplastic layers. The multi-layer sheet form lamp is then formed into a desired three-dimensional shape.

In another aspect, the invention provides a three-dimensional illuminating object including forming a lamp member with the following steps. A generally sheet-form biaxially oriented light-transmitting polyester carrier substrate is provided upon an electroluminescent lamp. The electroluminescent lamp includes a thin film transparent electrode deposited on the carrier substrate and a plurality of intimately bonded superposed polyvinylidene fluoride layers including a layer containing phosphor particles, a layer containing insulative particles and a layer containing conductive particles forming a back conductive electrode. The lamp member is heated to a molding temperature in the range between 190° F. and 270° F. and molding the heated lamp member at the temperature to a desired three dimensional shape whereby shrinkage of the carrier substrate is avoided and the operational integrity of the polyester carrier substrate and the polyvinylidene layers is maintained. The lamp member is then cooled in the three-dimensional molded form In another aspect, a method of constructing a three dimensional illuminating object includes forming a lamp member by providing upon a generally sheet-form, light-transmitting thermoplastic carrier substrate an electroluminescent lamp including a thin film transparent electrode deposited on the carrier substrate and, thereon, intimately bonded superposed thermoplastic layers having a layer containing phosphor particles that forms a phosphor layer, an insulative layer and a back conductive electrode layer. The lamp member is placed over a die of desired three-dimensional shape. The lamp member is then pressure formed by pressing the lamp member against the die to form the lamp member to the desired three-dimensional shape under conditions maintaining the operational integrity of the carrier substrate and the thermoplastic layers to produce a formed shape capable of emitting light.

Embodiments of these aspects of the invention may include one or more of the following features.

The heating step includes heating the multi-layer, sheet-form electroluminescent lamp in a temperature range below the softening point temperature of the carrier substrate, e.g., in a temperature range between 190° F. and 270° F., and preferably in a range between 230° F. and 260° F. At least one of the conductive layers includes a fluoropolymer resin.

The forming step includes applying pressure after heating of the multi-layer, sheet-form electroluminescent lamp. In one embodiment of the invention, the method includes the steps of providing a die having a male member and a mating female member, which together define the desired three-dimensional shape; heating at least one of the male member and female member of the die; positioning the multi-layer, sheet-form electroluminescent lamp between the male member and female member of the die; and applying pressure to the male member and female member of the die. A clamp is used to apply the pressure to the male and female members.

Where multiple lamps are employed, a first one of the electroluminescent lamps has a light-emitting characteristic (e.g. color, intensity) that is different than a light-emitting characteristic of a second one of the electroluminescent lamps.

The multi-layer, sheet-form electroluminescent lamp includes contact conductors, which may be deformed to provide spring detents. In some embodiments, the conductors are deformed in a direction opposite to that of another of the conductors.

In constructing a three dimensional illuminating object including a formed lamp member, the carrier substrate is a biaxially oriented sheet and may be a polyester including any of a variety of polymers or a polycarbonate material. The thermoplastic layers include polyvinylidene fluoride, fluoropolymer vinyl, polyester, polyimide or other thermoplastic resins. Prior to pressure forming the lamp member, the lamp member is heated to a molding temperature below the softening point temperatures of the thermoplastic of the carrier substrate and of the thermoplastic resins of the superposed layers and, thereafter, the lamp member is cooled in the molded three-dimensional form. The molding temperature is below a temperature at which substantial shrinking of the carrier substrate occurs. The molding temperature is in the range between 190° F. and 270° F. and is preferably between 230° F. and 260° F.

The three dimensional illuminating object can be in the form of a decorative embossed, self-illuminating figure or alphanumeric symbol. Alternatively, the three dimensional illuminating object can be in the form of a shaped pendant self-illuminating ornament or identifying logo.

In general, the achievement of a single overall lamp module that is practical and inexpensive to manufacture, and which selectively emits various qualities of light at freely selectable locations is a particularly important practical achievement of the present invention. Another important achievement is the practical achievement of three-dimensional electroluminescent lamps and structures carrying such lamps.

Other advantages and features of the invention will become apparent from the following description and from the claims.

BRIEF DESCRIPTION OF THE DRAWINGS

FIGS. 3A–3D are cross sectional side views of a surface mounted lamp being bonded to a substrate.

FIG. 8C is a cross-sectional side view of an electroluminescent lamp taken along lines 8C—8C of FIG. 8B.

FIGS. 14B–14C are cross-sectional side views of the electroluminescent lamp taken along lines 14B—14B and 14C—14C, respectively of FIG. 14A.

FIG. 15A is a plan view of a decorative figure having embossed electroluminescent lamps.

FIG. 15B is a front view of an embossed electroluminescent lamp of FIG. 15A.

FIG. 15C is a side view of an embossed electroluminescent lamp of FIG. 15A.

FIG. 15D is a top view of an embossed electroluminescent lamp of FIG. 15A.

FIG. 17 is a plan view of another embodiment of a lamp assembly having electroluminescent lamps and rigid lamps.

FIG. 17A is an enlarged view of one of the rigid lamps of FIG. 10.

DETAILED DESCRIPTION

Figure 1:
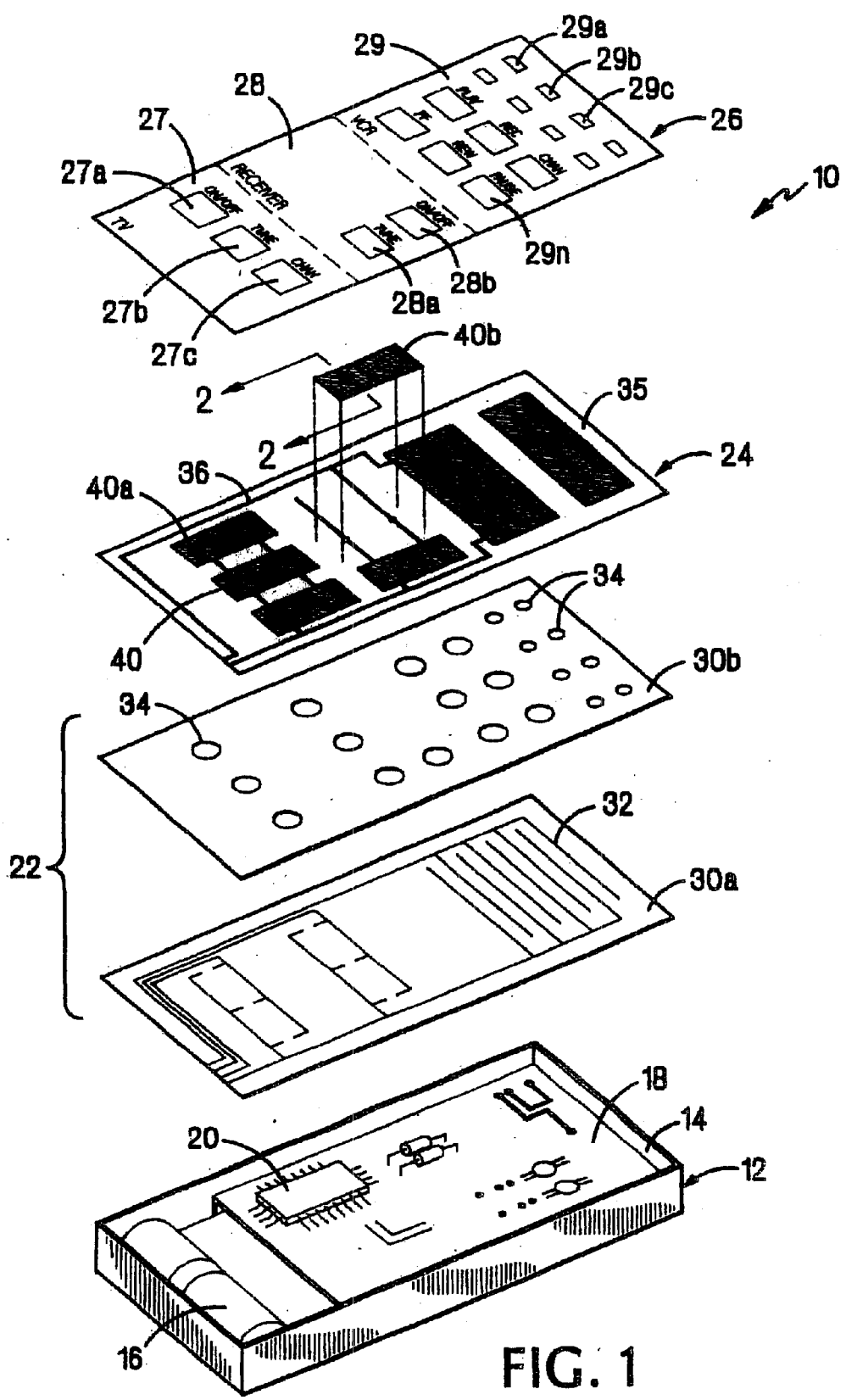
FIG. 1 is an exploded view of a hand-held remote control unit having surface mounted electroluminescent lamps according to the invention.

Referring to FIG. 1, a hand-held remote control device 10 for controlling a number of audio/visual instruments (e.g. television, VCR, stereo receiver) includes a housing 12 having a cavity 14 supporting a battery 16 and a control board 18. Control board 18 includes components 20 used to distribute power and signals for generating an infrared control signal to be received by the instruments. In addition, a switch keypad 22, a modular lamp circuit 24, and a graphics panel 26 are disposed within cavity 14 in vertical succession. Graphics panel 26 includes a graphic having areas 27, 28, 29 associated with each controlled component. Each area 27, 28, 29 further has regions 27a–27n, 28a–28n, 29a, 29n designating particular functions (e.g. on/off, volume, channel select) associated with the component designated for that area. A bezel (not shown) may be used to secure the graphics panel 26 to housing 12. With this arrangement, remote control unit 10 has an illuminated tactile membrane keypad operated by depressing regions associated with a selected audio/visual instrument.

Switch keypad 22 includes a flexible polyester board 30a having conductive traces 32 connected to control board 18 with a switch board 30b disposed thereon. Switch board 30b includes shorting switches 34, each switch corresponding to a particular function of a particular component and positioned over a region of circuit board 30a such that application of a downward force on the switch effectively "shorts" traces 32 corresponding to a particular function.

Modular lamp unit 24 produced using techniques of the present invention is disposed between switch keypad 22 and graphics pane 126 and includes a flexible printed circuit substrate 35 having conductive traces 36 of conductive ink upon which a number of flexible electroluminescent lamps 40 have been placed. Each electroluminescent lamp 40 has a pair of conductive pads 41a (FIG. 4A) formed by conductive ink deposits on the plastic substrate. These conductive pads provide electrical connection points to conductive traces 36 leading to power and ground buses. Portions of conductive traces 36 that are not connection points to conductive pads 41a of lamps 40 are generally covered with a dielectric layer to provide electrical isolation, reduce silver migration, and to provide moisture protection. One method of providing such a dielectric layer is to screen print a UV curable ink, for example, Product No. 5014, manufactured by E.I. DuPont de Nemours & Co., Wilmington, Del., over portions of conductive traces 36 on flexible substrate 35. Flexible substrate 35 is made from a polyester based material, model no. ST505, a product of ICI Corp., Wilmington, Del. having a thickness of about 0.007 inches and a surface with a coating of indium tin oxide subsequently applied.

Figure 2:
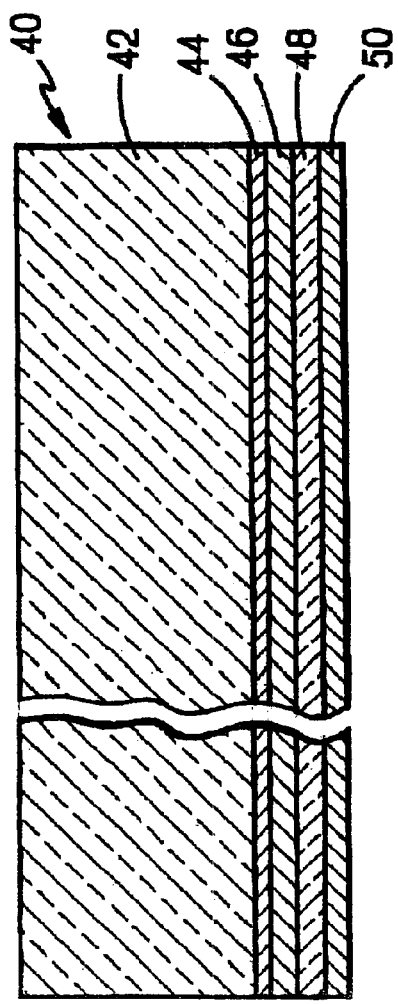
FIG. 2 is a cross sectional side view taken along lines 2—2 of FIG. 1.

Referring to FIG. 2, an exemplary electroluminescent lamp 40 is shown. It is limited in size to a specific area to be illuminated and comprises a number of layers beginning with a transparent substrate 42, (e.g., a sheet of polyester film approximately 0.007 inches thick). Substrate 42 has on one side a pre-applied coating of a transparent conductive material, preferably, an organic conductor coating, such as indium tin oxide (ITO), although aluminum oxide, aluminum, gold and silver or other composite coatings may also be used. The ITO material is preferably vacuum sputtered onto the substrate panel to form a transparent front coating 44 that is approximately 1000 D thick. Transparent front coating 44 is covered with a phosphor layer 46 formed of electroluminescent phosphor particles, e.g., zinc sulfide doped with copper or manganese which are dispersed in a polymeric binder. Phosphor layer 46 is applied to the front transparent coating 44 by screen printing and has a thickness of approximately 0.001 inches. A dielectric layer 48, approximately 0.001 inches thick, is formed of a high dielectric constant material, such as barium titanate or titanium dioxide, dispersed in a polymeric binder. Dielectric layer 48 is screen printed over phosphor layer 46 so that it extends to the edges of the lamp 40. Deposited over the dielectric layer 48 is a rear electrode 50 formed of conductive particles, e.g., silver, or carbon, dispersed in a polymeric binder to form a screen printable ink. The ink is screen printed onto dielectric layer 48 to form rear electrode 50 in a layer approximately 0.0005 inches thick. In some applications of lamp 40, an additional insulating layer (not shown) may be applied over rear electrode 50 to prevent possible shock hazard or to provide a moisture barrier to protect the lamp. Suitable polymeric binders for these layers include PVDF as described in U.S. Pat. No. 4,816,717, and U.S. Pat. No. 5,770,920, both of which are incorporated herein by reference.

Referring again to FIG. 1, each of the pre-formed electroluminescent lamps 40 is positioned between particular shorting switches 34 of switch keypad 22 and corresponding areas 27, 28, 29 of graphics panel 26. The flexible nature of lamps 40 permits the downward force applied to cover plate 26 to be transferred to shorting switches 34 without damaging lamps 40. In this embodiment, electroluminescent lamps 40 associated with particular regions of graphics panel 26 have different selected colors. For example, area 27 associated with television functions is illuminated with an electroluminescent lamp 40a emitting orange light while area 29 associated with controlling a video cassette recorder (VCR) is illuminated with lamp 40b emitting blue light.

Referring to FIGS. 3A–3D, a process for bonding the small pre-formed electroluminescent lamps 40 to the flexible substrate 35 of the modular unit is shown.

Figure 3A:
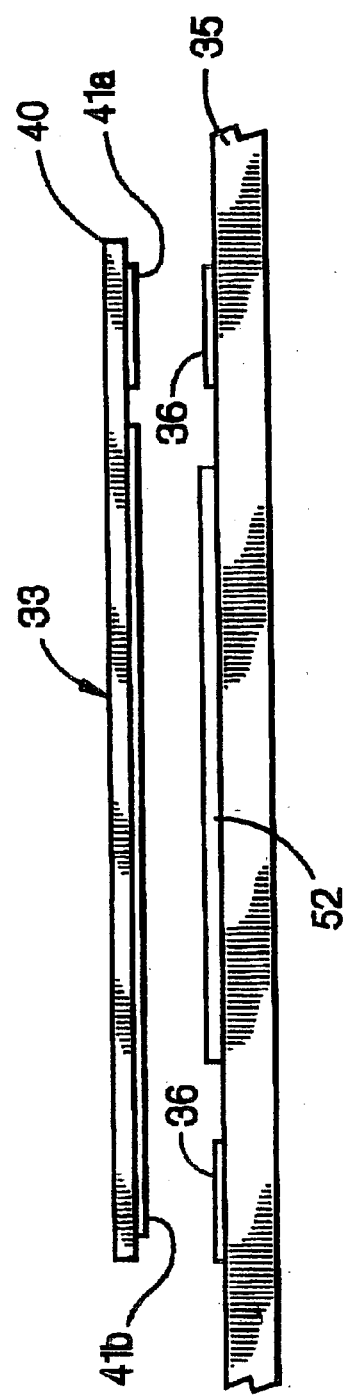

As shown in FIG. 3A, lamp 40 with lit side 33 facing up is positioned on flexible substrate 35 such that conductive pads 41a, 41b of the lamp are superposed over traces 36 of the substrate. A small drop of adhesive or as shown here, a double-sided pressure sensitive adhesive strip 52 is placed between flexible substrate 35 and rear electrode 50 of lamp 40 at a region between conductive pads 41a, 41b to lightly fasten lamp 40 to flexible substrate 35. Referring back to FIG. 2, conductive pad 41b is directly connected to rear electrode 50 while conductive pad 41a is connected to transparent front coating 44 through a via hole (not shown). Adhesive strip 52 permits the lamp 40 and flexible substrate 35 combination to be flipped over during the course of manufacture such that lamps 40 are beneath the board for reasons as explained below.

Referring to FIG. 3B, lamp 40 is electrically and mechanically bonded to flexible substrate 35 using an ultrasonic welder 54 (FIG. 5), such as Model 901AE IW Integrated Welder, manufactured by Branson Ultrasonics Corp., Danbury, Conn. As described above in conjunction with FIG. 3A, the lamp 40 and flexible substrate 35 combination may be flipped over and provided to welder 54 so that an under surface 37 of flexible substrate 35 faces a knurled welding tool 56 positioned above the region of conductive pad 41a of lamp 40. Knurled welding tool 56 has a diameter of about 0.25 inches and a tip having a grid array of relatively sharp prongs 60 approximately 0.020 inches long and spaced from each other by 0.030 inches. With this arrangement, transparent coating 44 of lamp 40 is face down on an X-Y base plate 58 of welder 54. Welder 54 is electronically programmed to position welding tip 56 over a plane parallel with base plate 58.

Figure 3C:
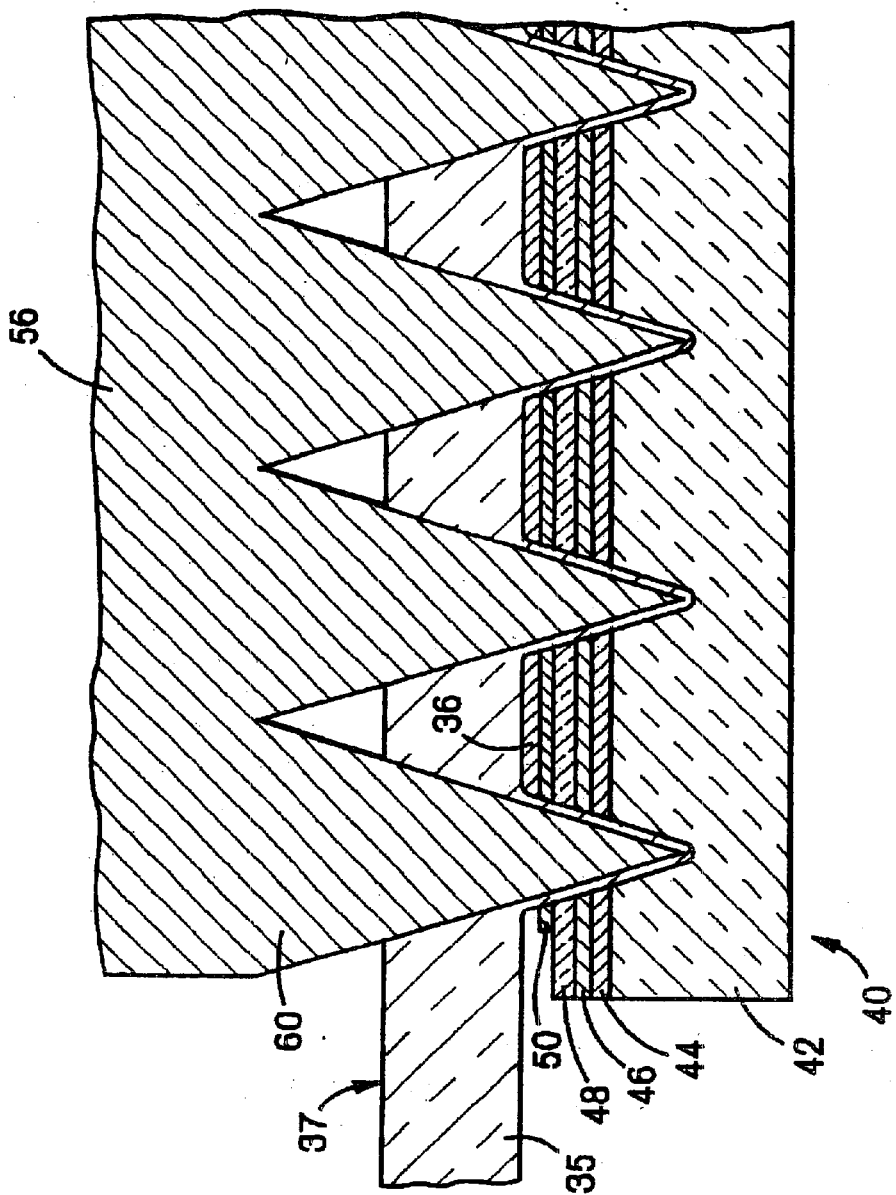

As shown in FIG. 3C, welder 54 is programmed to lower knurled welding tool 56 to undersurface 37 with a predetermined force an d for a precise duration of time so that prongs 60 penetrate through flexible substrate 35 and into lamp 40. Prongs 60 extend through rear electrode 50, phosphor 46 and into transparent substrate 42 of lamp 40. As is known by those in the art, vibration welding is a technique for producing strong structural or high-pressure seals between thermoplastic materials. High frequency electrical energy (20 kilohertz) is provided by a solid state power supply to a converter unit (not shown) of welder 54. The converter unit changes the electrical energy into mechanical vibratory energy at ultrasonic frequencies. The vibratory energy is transmitted to the joint area through welding tool 56 and is converted to heat at the prongs of the tool through friction. In this embodiment, the undersurface 37 of flexible substrate 35 is vibrated against the rear electrode 50 of lamp 40 under a pressure of 10–20 lbs/in2, for 25–75 milliseconds. Frictional heat generated at the interface area causes the polyester material of flexible substrate 35 and transparent substrate 42 to fuse such that a strong molecular bond is provided therebetween.

Figure 3D:
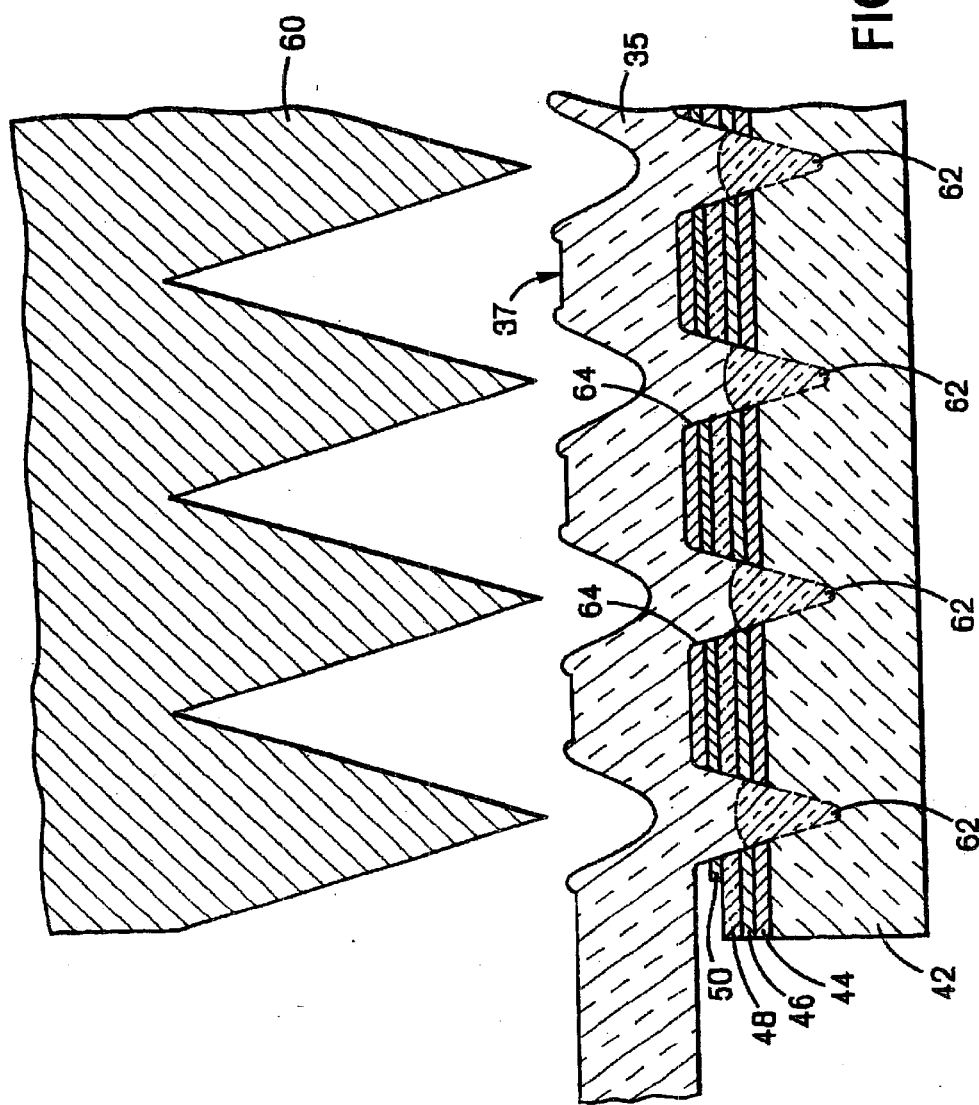

Referring to FIG. 3D, to complete the weld operation, knurled welding tool 56 is lifted away from flexible substrate 35 leaving behind mechanical contact points 62 of fused polyester of flexible substrate 35 and transparent substrate 42 of lamp 40. The weld strength of mechanical contact points 62 approaches that of the parent material. Concurrently, the localized heat and vibration provided by the knurled welding tool 56 forces the screen printable conductive polymeric ink of rear electrode 50 away from the penetration locations to form electrical contact paths 64 between mechanical contact points 62, so that electrical continuity is assured.

Figure 4A:
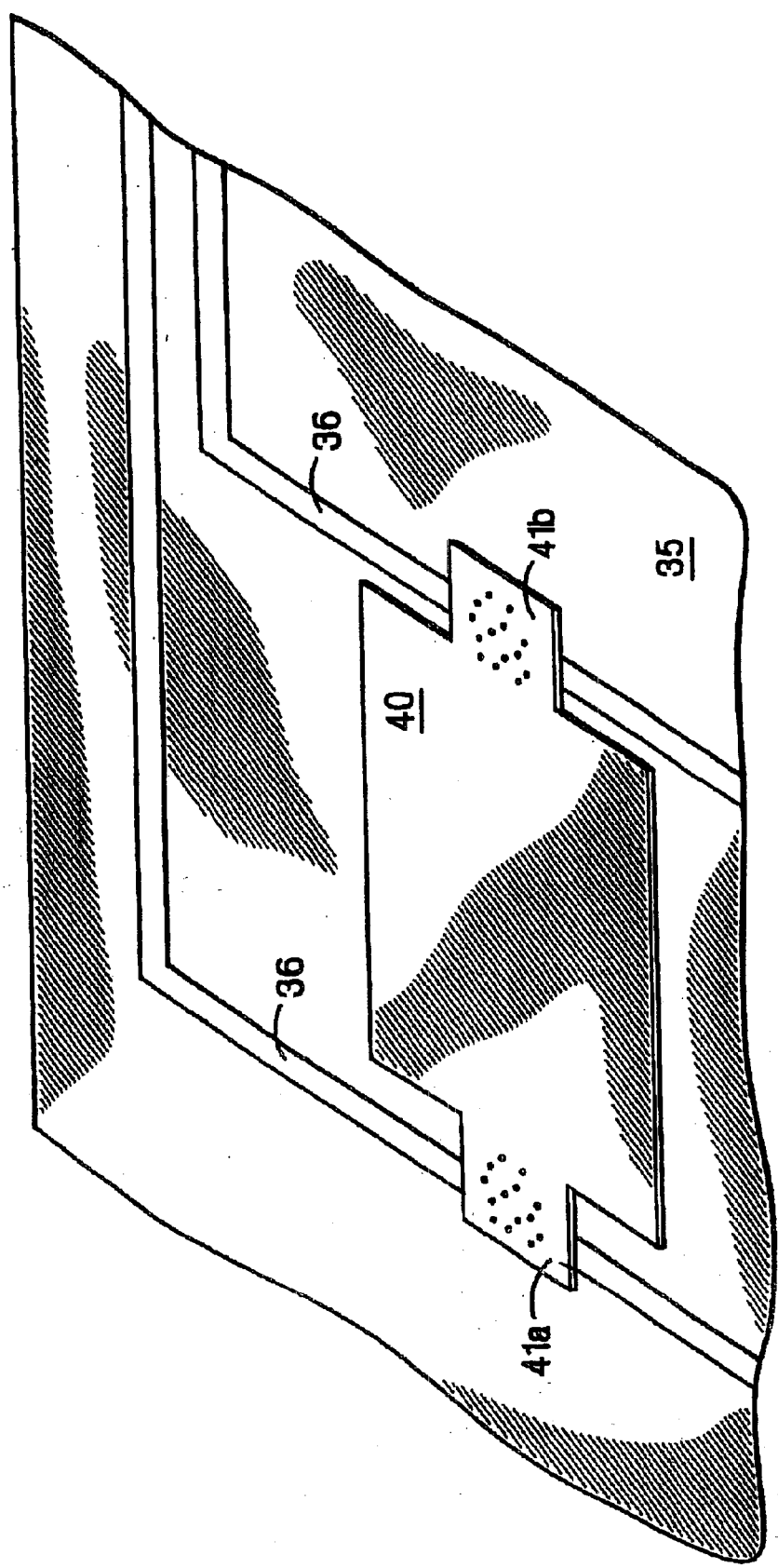
FIGS. 4A–4B are top views of surface mounted lamps bonded to a substrate.
Figure 4B:
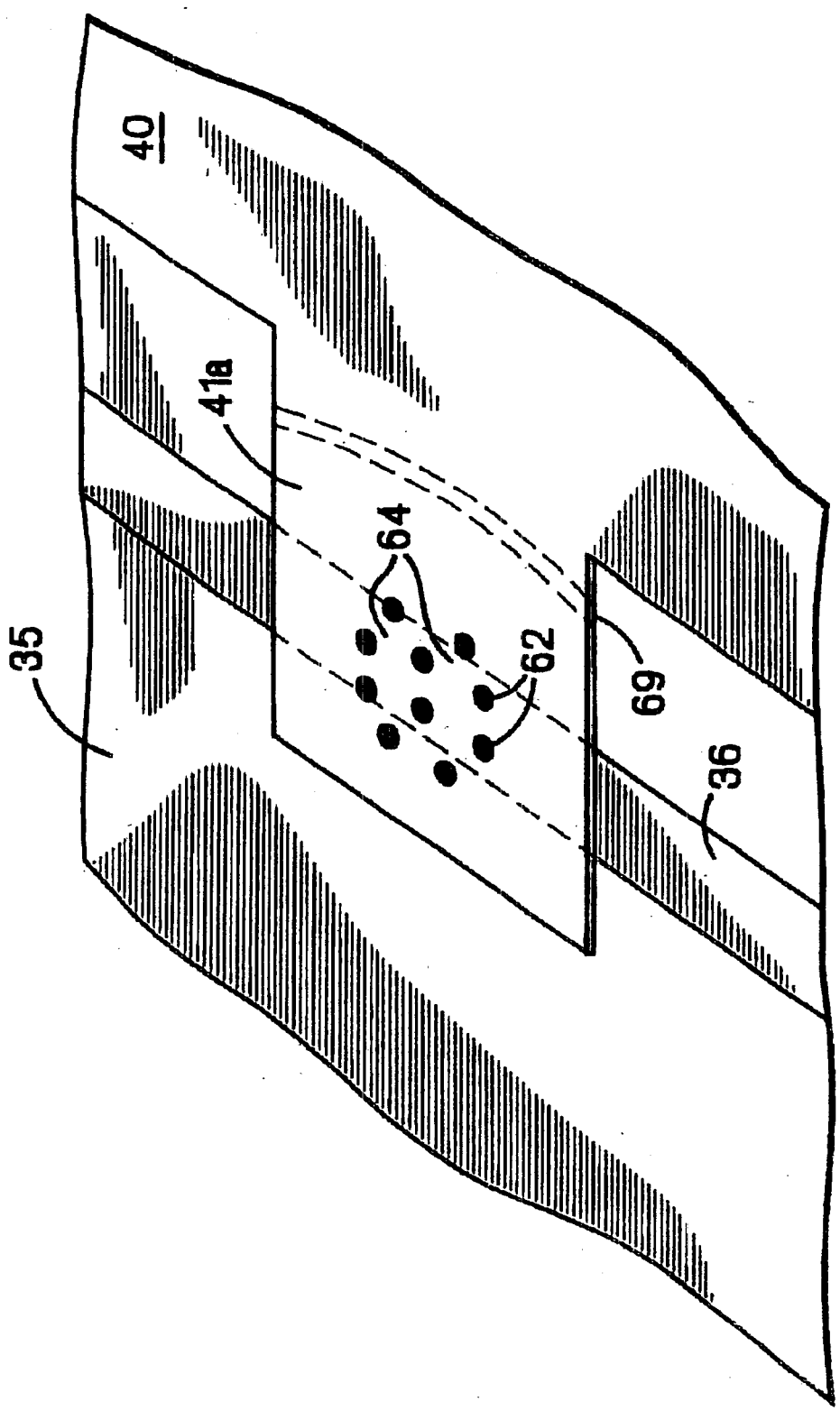

Referring to FIGS. 4A and 4B, lamp 40 is shown having a pair of conductive pads 41 a attached to conductive traces 36 of flexible circuit 35. The grid arrangement of prongs 60 of welding tool 56 is used to provide the grid of fused mechanical contact points 62 and conductive ink to conductive ink electrical contact paths 64 between printed rear electrode 40 and printed conductive traces 36. A line of interruption 69 is laser scribed through rear electrode 50 to provide electrical isolation between the rear electrode 50 and front electrode 44. Electrical isolation is provided because connection of rear electrode 50 to flexible substrate 35 as described in FIGS. 3A–3D (or when using methods described below) can cause front electrode 44 to short with rear electrode 50. Further details for providing electrical isolation between a rear electrode and a front electrode is described in U.S. Pat. No. 5,332,946, which is incorporated herein by reference.

Figure 9:
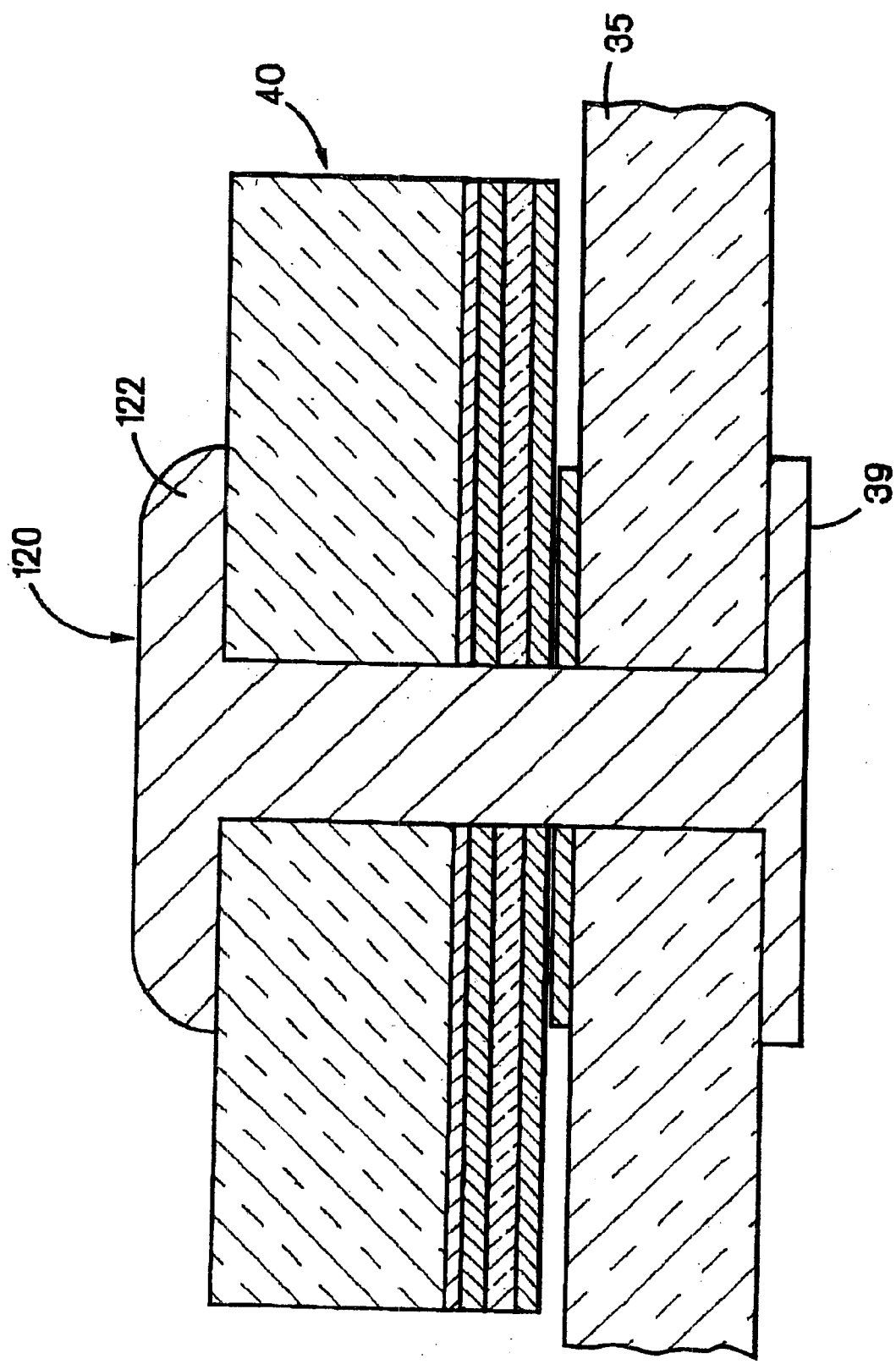
FIG. 9 is a cross-sectional view of a surface mounted lamp attached to a flexible substrate using a mechanical eyelet.
Figure 10:
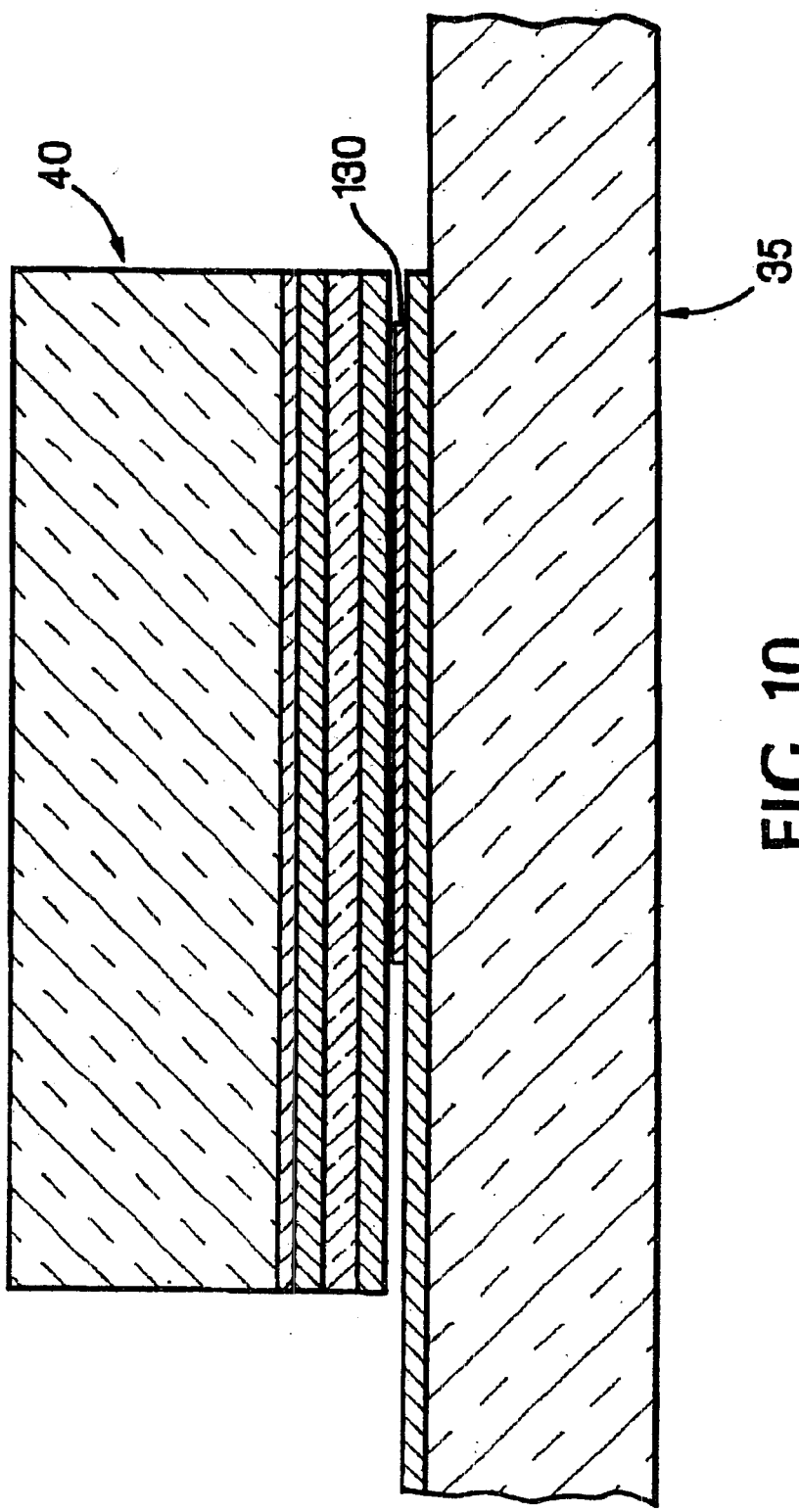
FIG. 10 is a cross-sectional view of a surface mounted lamp attached to a flexible substrate using an adhesive strip.

It is appreciated that the small, pre-formed lamps 40 may be connected to flexible substrate 35 using other attachment means. Referring to FIG. 9, for example, a mechanical eyelet 120 is shown having a headed pin portion 122 that is disposed through lamp 40 and flexible substrate 35 and flattened at a bottom surface 39 of substrate 35 to fasten lamp 40 firmly to the substrate. Alternatively, as shown in FIG. 10, a strip of strong conductive adhesive film 130, such as Model No. 9703, a product of 3M Corporation, Minneapolis, Minn. is used to securely fix lamp 40 and substrate 35.

Figure 5:
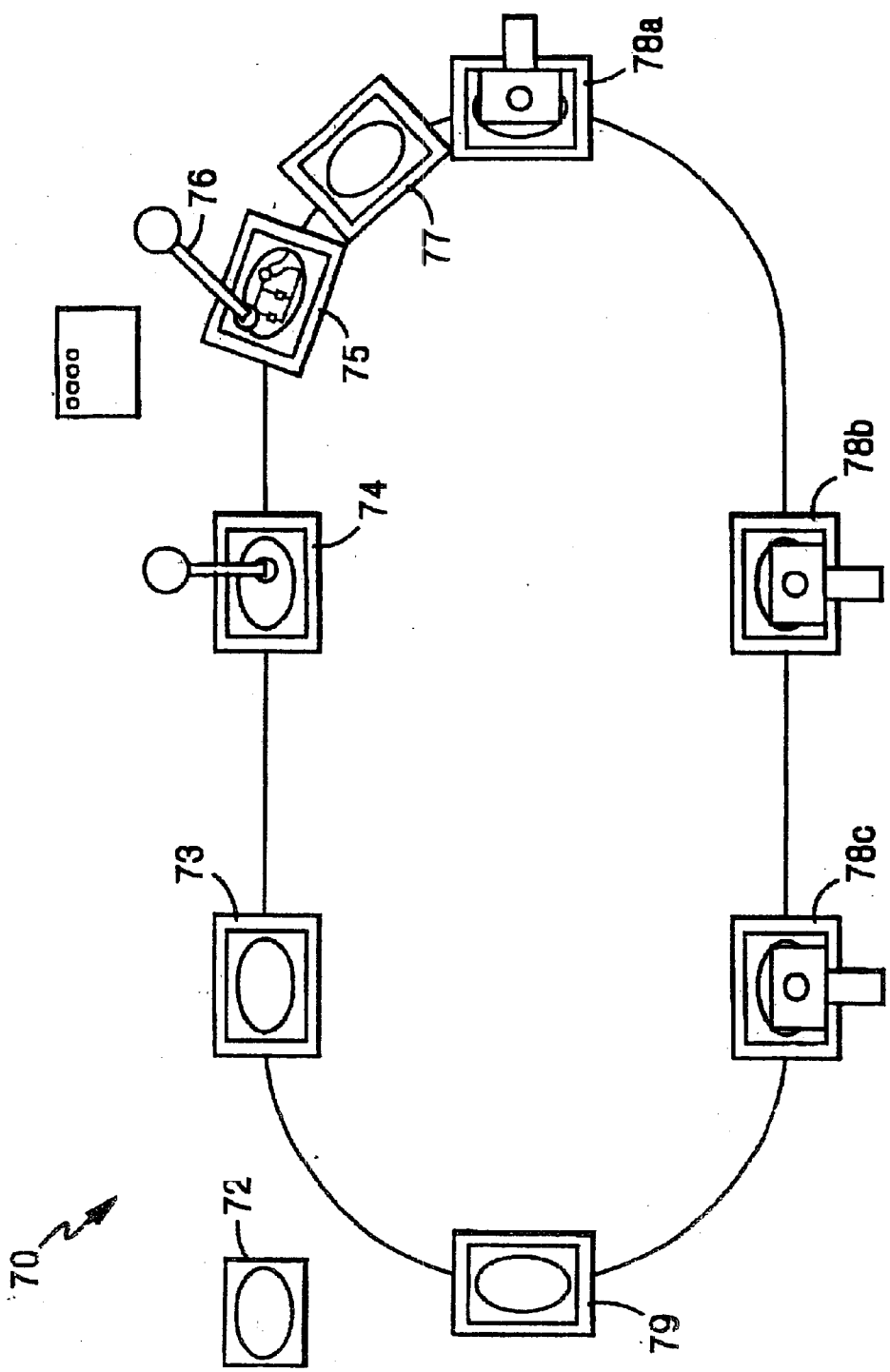
FIG. 5 is a plan view of a surface mounted lamp assembly station.

The process of securing preformed lamps 40 of selected small size to flexible substrate 35 is advantageously adapted for use in an automated production line environment. Referring to FIG. 5, an automated lamp mounting assembly line 70 is supplied an inventory of flexible substrates 35 having predetermined conductive traces 36 and predetermined areas for securing lamps 40. Flexible substrates 35 are conveyed along a line past a series of production stations. At a preparation station 72, for example, substrates 35 are cleaned and prepared for receiving lamps 40 before being conveyed to loading station 73. Each substrate 35 is generally supported on a rigid template to provide support to the flexible substrate as it moves from station to station and to provide registration for the welding procedure. Assembly aides such as adhesive tape 52, 130 (described in conjunction with FIGS. 3A and 10) or epoxy adhesives are placed at appropriate locations on flexible substrate 35 at an adhesive dispensing station 74. Dispensing station 74 here, includes a syringe that is controlled to dispense a "dot" of quick-drying or quick-curing epoxy, sufficient for supporting a lamp 40, onto an area of the lamp removed from conductive pads 41a.

Lamps 40 are placed on substrates 35 in a "pick and place" fashion at a numerically controlled lamp-mounting station 75 having a robot arm 76. A wide variety of lamps 40 having different sizes, colors, and intensities are supplied from selection trays or from a spool of flexible electroluminescent lamps. A bill of instructions defining the number, type, and position of lamps 40 to be bonded to flexible substrate 35 is provided to assembly line 70 to instruct robot arm 76 to select and properly position lamps 40 on flexible substrate 35. The robot arm 76 uses a vacuum pick up mechanism to retrieve lamp 40 having uncured epoxy applied thereto, positions, and presses the lamp for a sufficient time to allow the epoxy to partially cure and returns to retrieve a next lamp.

For certain modular lamp assemblies, it may be necessary to use a flip station 77 to turn the flexible substrate/lamp combination over so that underside 37 (rear electrode 50) is presented face up to a series of welding stations 78a–78c. In such applications, the template is used to flip over flexible circuit 35.

Each one of welding stations 78a–78c operate as described above in conjunction with FIGS. 3B–3D to mechanically and electrically secure a particular lamp 40 to the flexible substrates 35 at a preselected position. In an alternate arrangement, a single welding station having a numerically controlled robot arm may be used to perform welding operations for all of the lamps 40 positioned on substrate 35.

Finally, completed modular lamp units are conveyed to an unload station 79 where they may be cleaned, inspected, tested and packaged for delivery.

Figure 6:
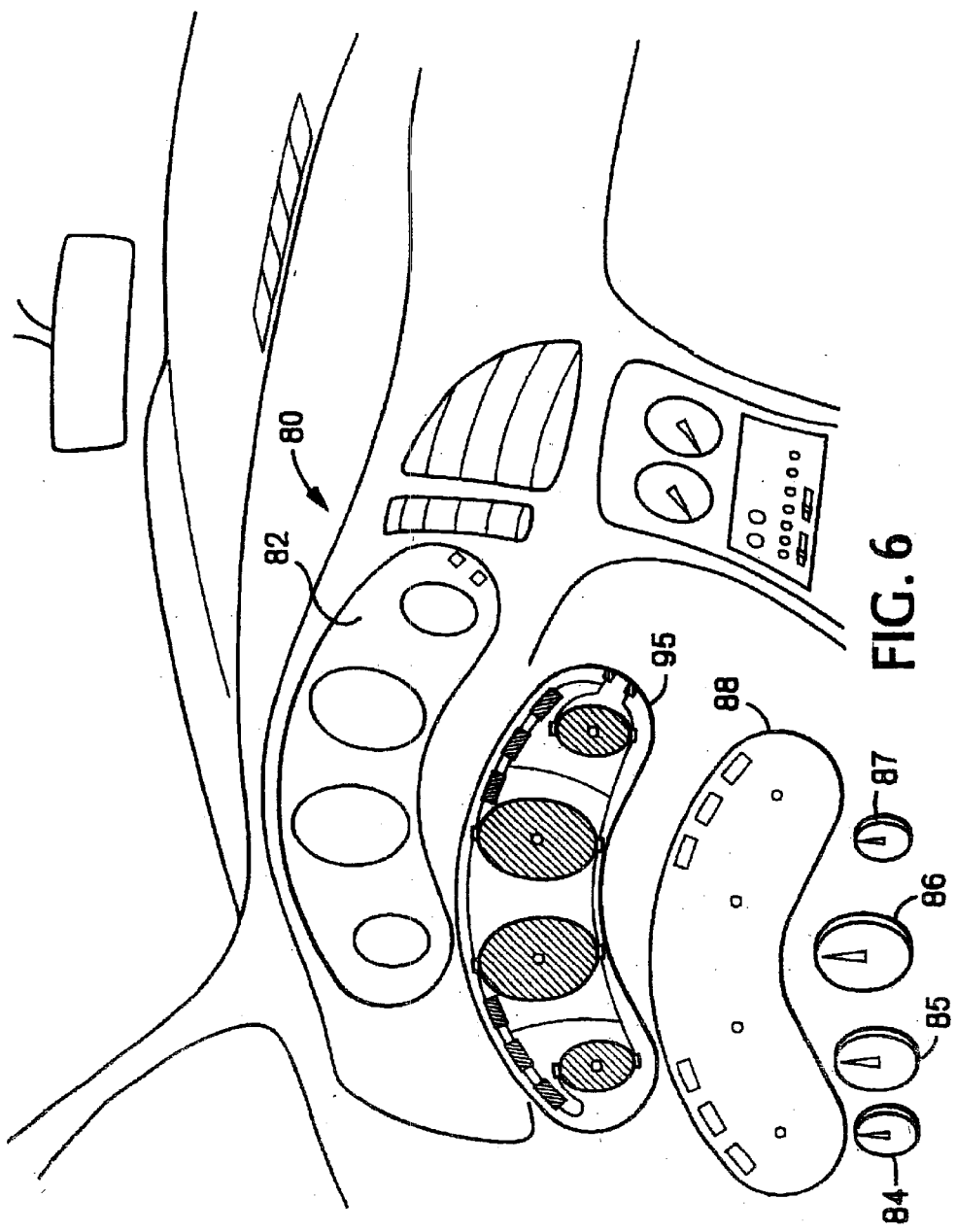
FIG. 6 is another embodiment having surface mounted lamps according to the invention.

Other embodiments are within the scope of the claims. For example, referring to FIG. 6, the interior of an automobile is shown to include an automobile dashboard 80 having an instrumentation mount 82 for supporting a dash panel 88 and gauges 84–87. Instrumentation mount 82 has a concave shape conforming to the curved dashboard of the stylized automobile cockpit. Gauges 84–87 include, for example, speedometer, tachometer, temperature, and fuel gauge functions. Dash panel 88 includes a printed graphic for warning indications 89–94, such as seat belt, open door/trunk high beam headlight and alternator functions.

Figure 7:
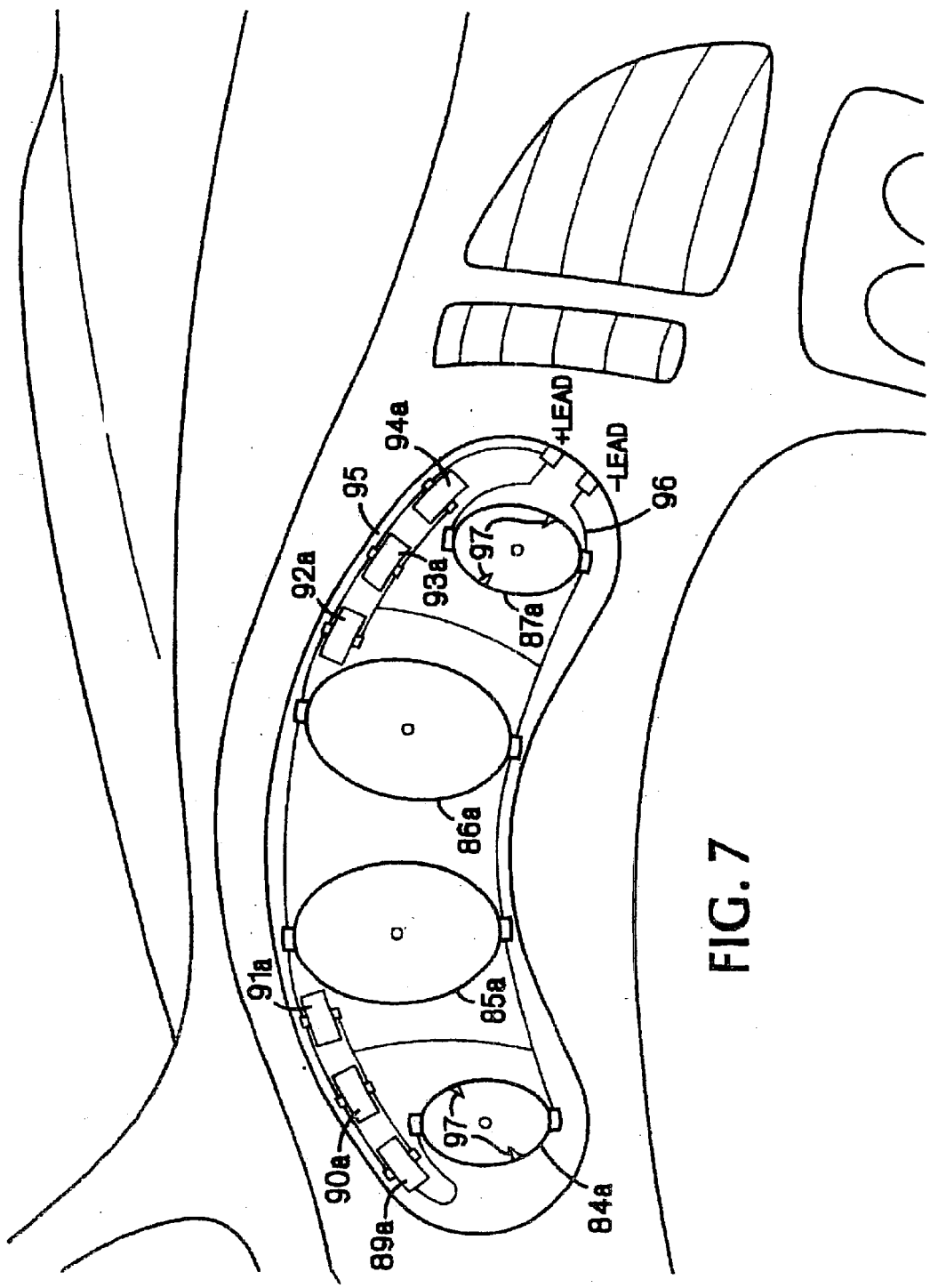
FIG. 7 is an enlarged view of the flexible circuit of FIG. 6.

Referring to FIG. 7, a pre-formed, flexible multi-lamp module unit manufactured in the manner described above is positioned within instrumentation mount 82 and behind both gauges 84–87 and dash panel 88. Flexible circuit 95 of the module is shown carrying electroluminescent lamps 84a–87a and 89a–94a connected with conductive traces 96 of the substrate to an electrical power source (not shown). Electroluminescent lamps 84a–87a and 89a–94a have sizes and shapes conforming to corresponding gauges 84–87 and warning indications 89–94 to be illuminated. Each electroluminescent lamp 84a–87a and 89a–94a is independently addressable and where appropriate is connected to a switch for connecting the lamp to the power source when a particular fault (e.g., seat belt unfastened) is detected. The multi-lamp flexible module may be deformed or flexed to the extent that regions having small radii of curvature exist. In these regions, flexible circuit 95 and attached lamps 84a, 87a may include strain relief incisions 97 to reduce bending stress 40 on lamps 84a, 87a and flexible circuit 95.

In another embodiment, not shown, the multi-lamp flexible module unit shown in FIG. 7 may be formed by employing, as a carrier substrate, a relatively thick self-supporting substrate of thermoplastic which, after manufacture in the flat, is formed by application of pressure and heat with lamps in place into a desired configuration.

In providing lamps for control panels such as the instrumentation mount 82 described above in conjunction with FIG. 7, the flexible substrate manufacturing approach is highly desirable, for being less expensive than forming rigid members. This is true even in the case where the flexible members are eventually joined to a rigid member.

For example, in certain circumstances, flexible electroluminescent lamps have insufficient brightness for applications requiring greater light intensity at localized regions (e.g., warning lights of a control panel cluster). It is within the scope of this invention to apply lamps made by other technologies on the flexible substrate for fulfilling the lighting requirements for these special applications, while presenting on the substrate, flexible electroluminescent lamps to provide back lighting of other features.

Referring again to FIG. 7, for example, electroluminescent lamps 89a–94a, associated with warning indications 89–94 may be in the form of rigid lamps which provide different lighting characteristics than flexible electroluminescent lamps. Substituting rigid lamps for flexible electroluminescent lamps is discussed below in conjunction with the embodiment shown in FIGS. 8A–8C.

In one embodiment, rigid electroluminescent lamps may be substituted for electroluminescent lamps 89a–94a. Such a lamp of less than 1 square inch area is attached to the substrate according to the invention. While not having the characteristic of being flexible, rigid electroluminescent lamps generally provide increased lamp intensity than their flexible counterparts. Moreover, because rigid electroluminescent lamps can be mounted to the substrate using the same surface mount techniques described above, they can be easily substituted for the flexible lamps 89a–94a used within instrumentation mount 82.

Referring to FIG. 17, in another embodiment, the rigid lamps may be in the form of a light emitting diode (LED) lamps 89b–94b. LED lamps offer the advantage of having an increased lamp intensity than a flexible electroluminescent lamp, albeit over a localized, smaller area. Moreover, LED lamps offer the advantage of providing the color red (among other colors) which is often desirable, particularly for warning indicators (e.g., turn signal, seat belt or oil pressure). It is generally difficult to provide the color red using electroluminescent lamps.

Similarly, in still another embodiment, the rigid lamps may be in the form of an incandescent lamp which also provides bright illumination which is "white" in nature at a localized, smaller area. In certain applications, colored lenses, filters or diffusers may be used with incandescent lamps to provide a wide variety of different colors with increased intensity.

In the above embodiments in which the rigid lamps are of the LED or incandescent type, the substrate may include holes to allow the lamps to be crimped into contact with the conductive traces 96. Alternatively, as shown in FIG. 17, sockets 101 for receiving lamps 89–94 may be positioned within the holes to connect to conductive traces 96.

In the case of forming the lamps themselves into three-dimensional objects, it is found advantageous to employ a process we refer to as "thermalforming". Thermalform is distinguishable from the well-known process of thermoforming in which a plastic film is heated to its softening point temperature and allowed to sag, before drawing it over or into a die by vacuum and/or pressure. Softening temperature and methods of measuring softening temperature are described in "Textbook of Polymer Science" by Fred W. Billmeyer, Jr., John Wiley & Sons, Inc., 1971, which is incorporated herein by reference. Thus, thermalforming is a very different process that is conducted at lower, controlled temperatures below the softening point temperature, in which pressure forming action is employed to conform the lamp to a mold without disturbing the operational integrity of the layers of the lamps. Thus, the lamp, in its new three-dimensional form, can still function as a lamp. For example, certain types of electroluminescent lamps such as the Durel-3™ electroluminescent lamp, manufactured by Durel Corporation, Chandler, Ariz., are fabricated on a carrier substrate comprising a biaxially oriented polyester film which is found to be conducive for being thermal-formed into a wide variety of three dimensional configurations. Alternatively, such electroluminescent lamps may be provided on polycarbonate films. Generally, the temperature limits for thermalforming lamps provided on such substrates is between 190° F. and 270° F., with a preferred range between 230° F. and 260° F. The upper limit is limited by the temperature at which the thermoplastic layers of the electroluminescent lamp are damaged and further, in the case of oriented polymeric substrates, by the temperature at which the carrier substrate is subject to shrinking. The thermoplastic layers of the lamp are generally comprised of polyvinylidene fluoride, polyimide, or, preferably a fluoropolymer and include a layer containing phosphor particles for forming a phosphor layer, a dielectric layer and a layer, e.g., containing conductive particles, for forming a back conductive electrode. It is important to note that the range of temperatures suitable for thermalforming is well below the heat set temperatures for polyester and polycarbonate bi-axially oriented films. The temperature required to permanently deform the lamp establishes the lower temperature limit. Thermalforming at these relatively low temperatures maintains the integrity of the carrier substrate and thermoplastic layers. Specifically, the phosphor layer, after thermalforming, provides a uniform distribution of light across the lamp and reliable electrical continuity is maintained across the conductive layer. In addition, shrinkage of the carrier substrate is avoided during the thermalform process.

Figure 11B:
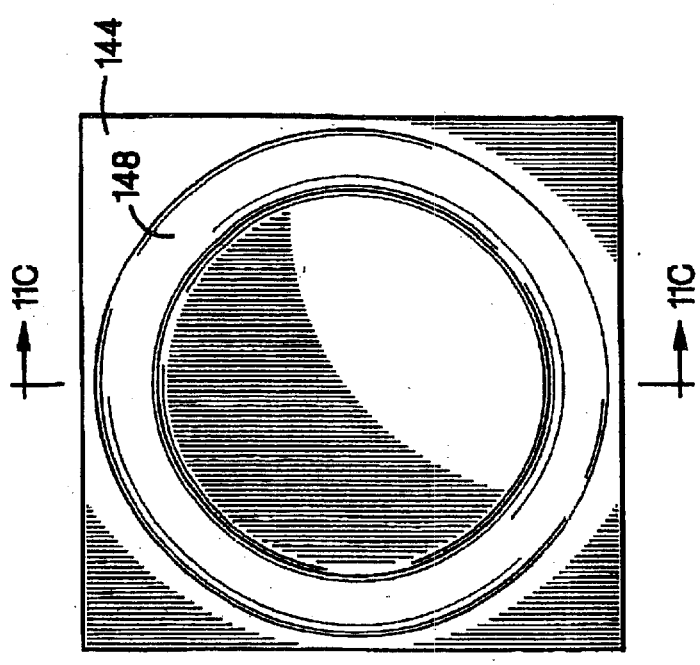
FIG. 11B is a top view of the formed electroluminescent lamp provided by the arrangement of FIG. 11A.
Figure 11C:
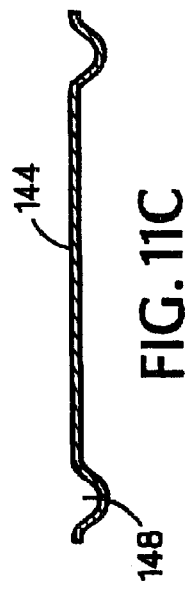
FIG. 11C is a side view of the formed electroluminescent lamp provided by the arrangement of FIG. 11A.
Figure 11A:
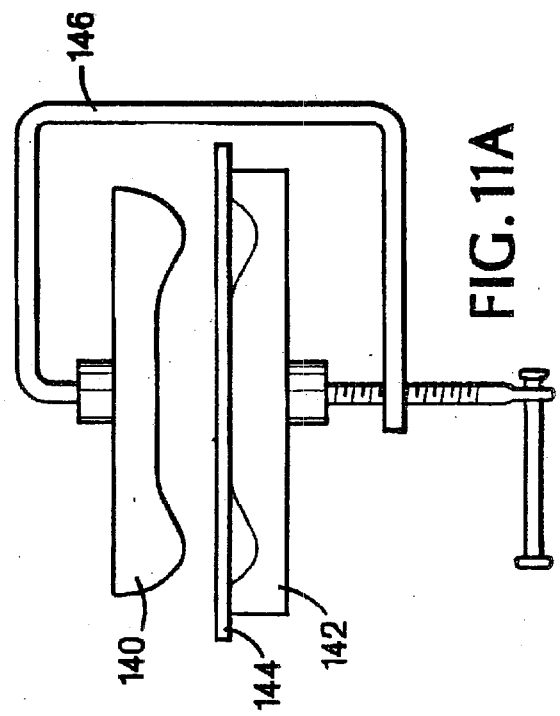
FIG. 11A is a side view of an arrangement for forming an electroluminescent lamp.

Referring to FIG. 11A, one method of thermalforming an electroluminescent lamp includes the heating of mated, male and female aluminum dies 140, 142 in an oven (not shown) to 250° F. A Durel-3 EL lamp 144 is placed between the dies 140, 142 and a "C" clamp 146 is used to provide slight pressure to hold the sandwiched parts together. The sandwiched lamp 144 and clamp 146 is returned to the oven at the same temperature for approximately eight minutes, is removed and the clamp 146 tightened. After 15 minutes of cooling, the clamp 146 is removed to provide the thermalformed lamp 144a. The thermalformed lamp 144 when attached to a power supply illuminates with uniform lighting provided in both thermalformed and flat regions of the lamp. As shown in FIGS. 11B and 11C, the shape of aluminum dies 140, 142 provide lamp 144a with a circular groove 148 and was used to demonstrate the degree of thermal deformation that the lamp 144 can experience during thermalforming without impairing its function.

Figure 12A:
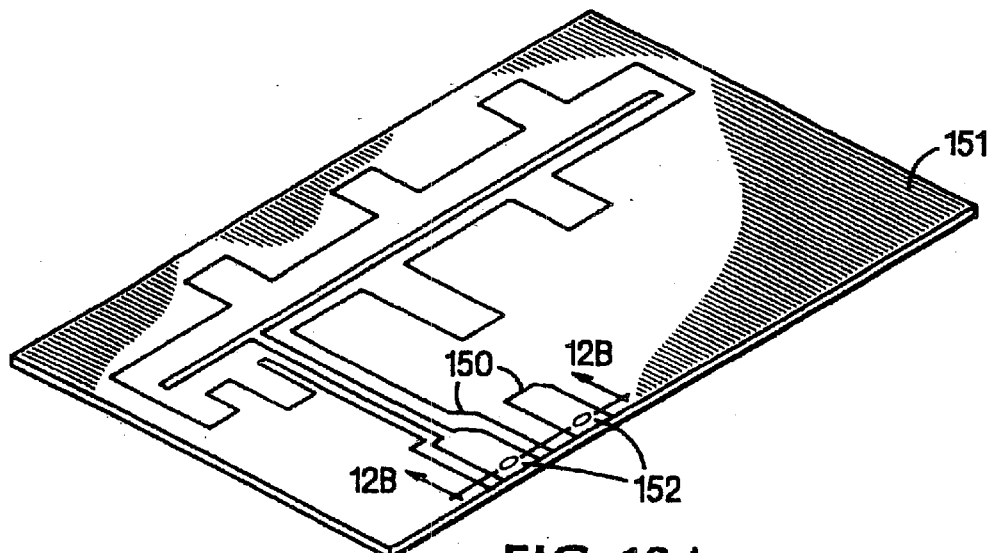
FIG. 12A is a perspective view of an electroluminescent lamp having molded spring detents.
Figure 12B:
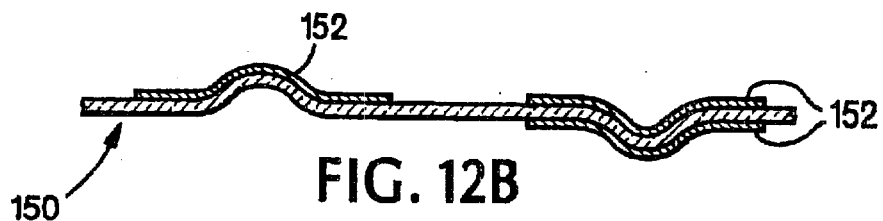
FIG. 12B is a cross-sectional side view of the electroluminescent lamp taken along lines 12B—12B of FIG. 12A.

In another application, shown in FIGS. 12A–12B, the planar pad portions 150 of a Durel 3 electroluminescent lamp 151 for supporting electrical contacts 152 are thermalformed in the manner described above in conjunction with FIGS. 11A–11C to provide spring detents. The pad portions are preferably deformed to be elevated above the plane of the surface of the electrode about 0.010 inch, although in certain applications 0.002 inches may be sufficient to provide the necessary spring effect. In applications where electrical power is provided to contacts on opposite surfaces of an electroluminescent lamp, conductive adhesives are typically used to maintain good electrical contact at the contact points. The spring detents provide constant pressure to the conductive adhesive at the connection point assuring electrical continuity to the lamp and its power source.

Figure 12C:
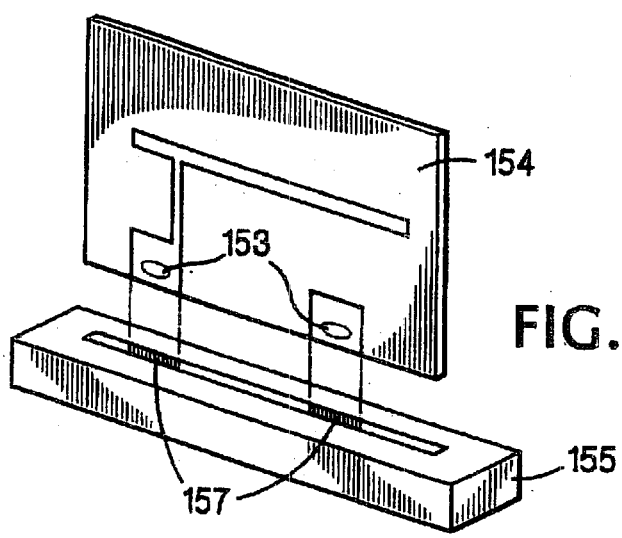
FIG. 12C is a perspective view of an electroluminescent lamp with molded spring detents for insertion into a mating receptacle.

In another embodiment, as shown in FIG. 12C. an electroluminescent lamp 154 has integral raised polymeric spring detents 153 thermalformed on contact pads for insertion into a receptacle 155. Receptacle 155 includes a mating connector having spring fingers 157 with a dimension slightly less than the height of detents 153. The spring detents 153 formed of the polymer of the lamp itself are compressed during insertion such that a wiping action is imparted between the contacts. It is appreciated that although FIGS. 12A–12B show the detents on opposite sides of the lamp, constructions with the detents on the same surface of the lamp are also possible.

Figure 13A:
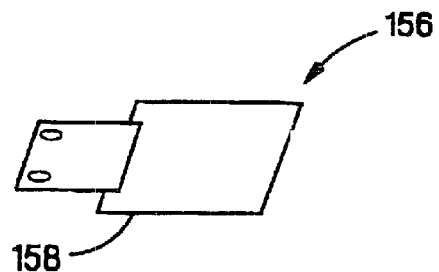
FIG. 13A is a side view of a variable light source electroluminescent lamp in its fully extended position.
Figure 13B:
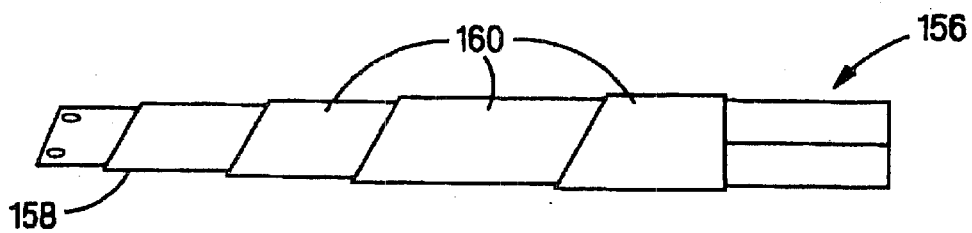
FIG. 13B is a side view of a variable light source electroluminescent lamp in its fully compressed position.
Figure 13C:
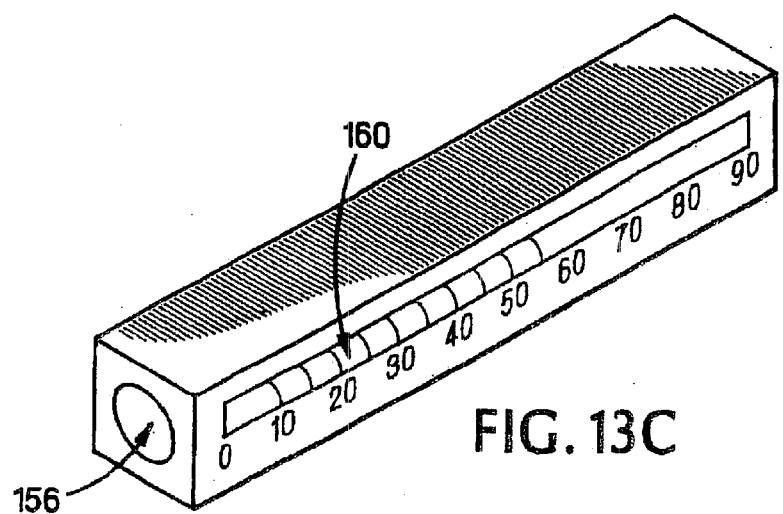
FIG. 13C is a perspective view of the variable light source electroluminescent lamp of FIGS. 13B and 13C used as an indicator in a speedometer.

In another embodiment, a thermalformed lamp may be constructed to provide a variable light output lamp 156. Referring to FIGS. 13A–13B, a one inch wide, eight inch strip 158 of Durel-3 EL lamp material is formed into a helical spiral of coils 160, adhesively clamped around a cylindrical mandrel and placed in a 250° F. thermal oven for 5 minutes. The clamped lamp material 158 is removed from the mandrel and allowed to cool for 7 minutes. Upon removal, the EL lamp 156 remains as a helical spring that can be compressed, but is biased to return to its elongated form. Referring to FIG. 13B, the EL lamp 156 when telescoped to its fully extended form, emits the maximum amount of light from the helical coils 160. Conversely, as shown in FIG. 13A, to reduce the light emitted, the helical coils 160 are compressed such that masking between the individual coils reduces the overall light emitted from the lamp 156. As shown in FIG. 13C, the variable light output lamp may be used for example in a automobile speedometer. In this embodiment, the variable light output lamp is mounted within the dash panel and is attached to the automobile's speedometer cable to provide the pressure necessary to permit the illuminated coils to elongate as the speed of the automobile is increased and shorten when the speed is decreased.

Figure 14A:
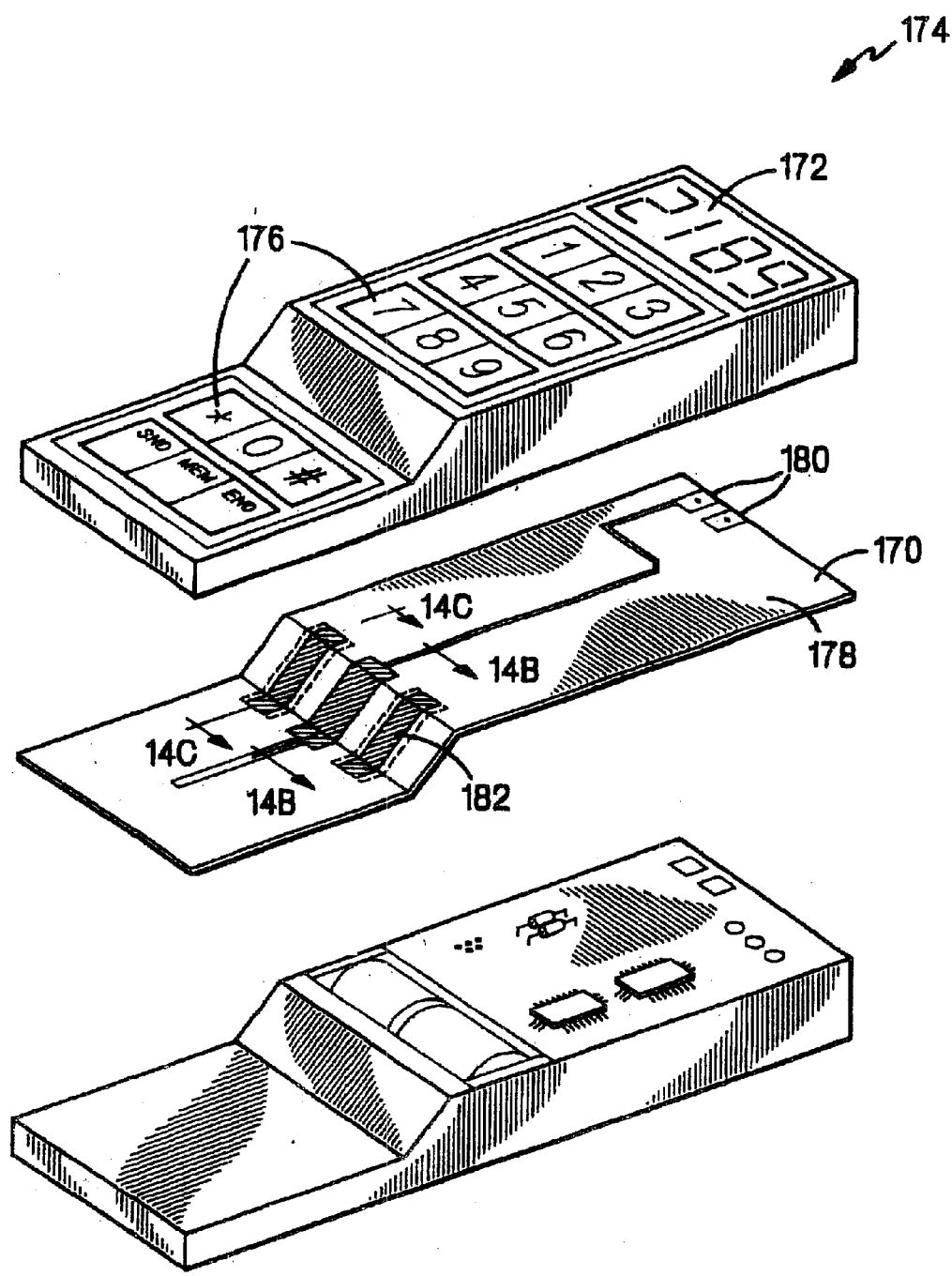
FIG. 14A is an exploded view of a hand-held telephone having a molded electroluminescent lamp according to the invention.

Referring to FIG. 14, in another embodiment, a thermalformed electroluminescent lamp 170 is shown for providing lighting to the front graphic 172 of a hand-held cellular telephone 174. The telephone includes a backlit keyboard 176 on two levels and a single thermalformed lamp 170 creased to conform to the transition region of the graphic. Thermal deformation of this degree may, in certain applications, cause cracking of the indium tin oxide (ITO) conductive coating and the rear electrode carbon ink coating of the lamp 170 along conductive traces 178 which extend from lamp contacts 180. Damage to the ITO layer of the conductive traces 178 can result in diminished light output from those areas of the lamp following the crease. Accordingly, in a preferred embodiment, silver carrier pads 182, in the form of a silver ink are used to bridge across the creased portions in order to maintain a reliable electrical connection across the surface of the lamp 170. Referring to FIGS. 14B and 14C, cross-sectional views through the creased portions of the front and rear electrodes, respectively, of the thermalformed electroluminescent lamp are shown. As is shown in FIG. 14B, a polyester carrier substrate 181 with an ITO layer 183 disposed thereon has silver carrier pad 182 screen printed over the portions to be thermnalformed. Phosphor, dielectric and rear electrode layers 184, 185 and 186. respectively, are subsequently deposited in succession over the silver carrier pad and ITO layer. Referring to FIG. 14C, the same process is used to provide a silver carrier pad through a rear electrode portion of the thermalformed lamp with the exception that the ITO layer 183 is laser etched at a region 187 prior to deposition of the phosphor, dielectric and rear electrode layers to provide isolation between the front and rear electrodes.

Because the mechanical force necessary to deform a structural thermoplastic circuit board member is generally greater than that required to deform the relatively thin polyester based flexible electroluminescent lamp, it may be desirable, in some applications, to thermalform the lamp prior to placing it on the three-dimensional shaped receptor surface portion of its mating printed circuit. Thus, the lamp is thermalformed to provide a three-dimensional shaped lamp member cooperatively sized and shaped to match with the three-dimensional shaped portion of the mating circuit without subjecting the lamp to the mechanical stresses that are necessary to form the three-dimensional structural portion.

The method of thermalforming can be used to provide three dimensionality to illuminated objects to highlight particular features and to increase the aesthetic nature of a product. Emblems or badges used as decorative or promotional items having illuminated portions may benefit from such a method. Referring to FIG. 15A, for example, a Christmas tree 190 includes electroluminescent lamps 192 representing ornamental balls placed on the tree. Each lamp may be thermalformed using a process such as the approach described above in conjunction with FIGS. 11A–11C to cause the ornamental balls to be raised from the surface of the sheet in semi-spherical form. FIGS. 15B, 15C, and 15D show a thermalformed lamp in front, side and top views, respectively. The lamps, embossed in this way, are more pronounced and more closely represent real Christmas ornaments hanging from a tree. In another embodiment, a pair of semi-spherical electroluminescent lamps disposed adjacent to each other on a relatively thin substrate may be hinged together by a living hinge formed by the substrate so that folding one lamp over the other provides a single illuminated spherically shaped lamp.

Figure 16:
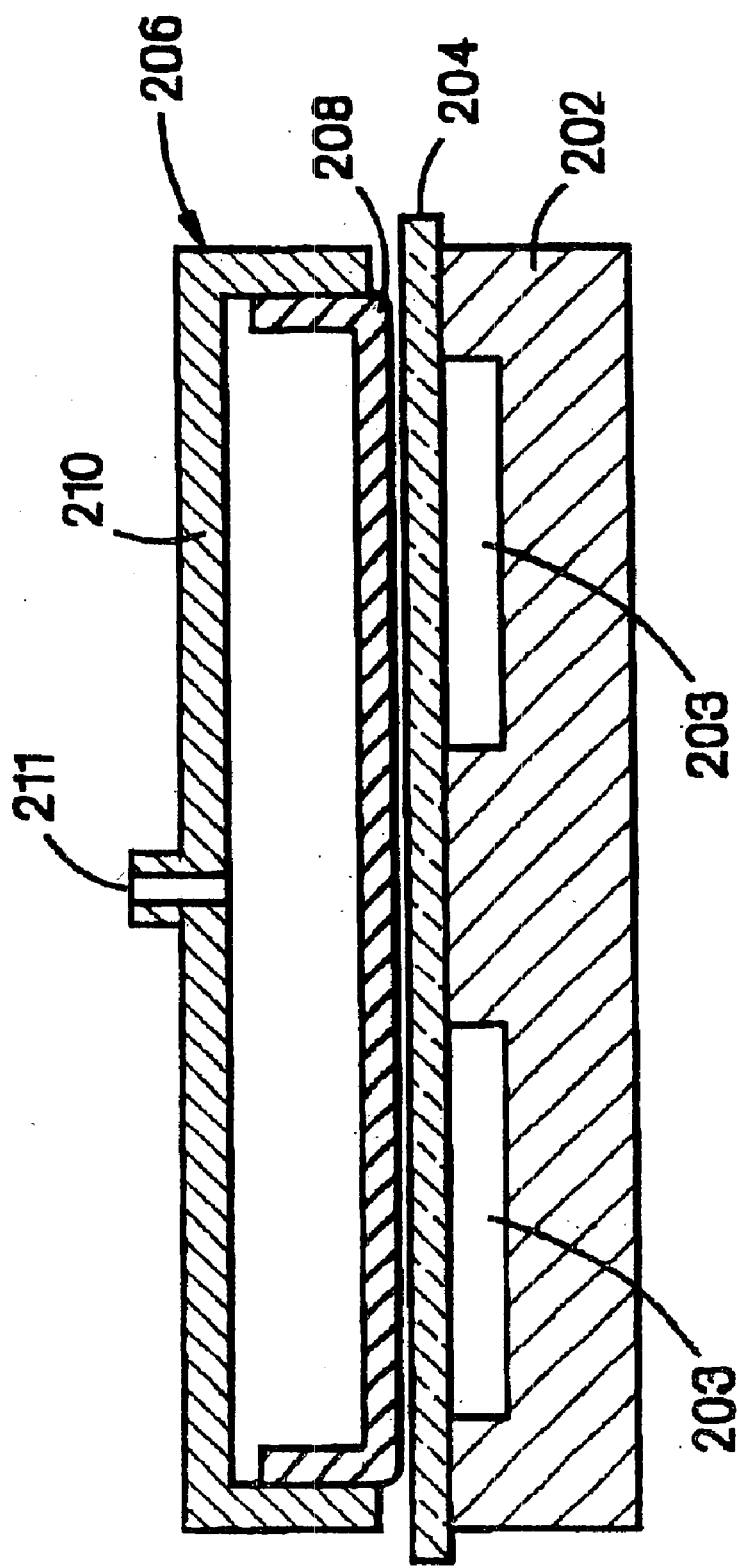
FIG. 16 is a cross-sectional side view of an alternate arrangement for forming an electroluminescent lamp.

It is appreciated that thermalforming of electroluminescent lamps may be applied to provide a raised or embossed image, such as the ornamental balls described above, or may be "debossed" to provide the image in a depressed form. Both approaches provide the added dimensionality to accentuate the images represented by the lamps and increase the aesthetics of the normally flat lamp. Embossing or debossing the electroluminescent lamps may be accomplished using the method described above in conjunction with FIG. 11A. Alternatively, an alternative mechanism, as shown in FIG. 16, includes a molding tool member 202 having concave portions 203 representing the shape of the emboss or debossed image. A sheet-form electroluminescent lamp 204 is placed over molding tool 202 and a pneumatic pressure member 206 having an elastomeric membrane 208 attached to a rigid backplate 210 is used to thermalform lamp 240. In operation, molding tool member 202 is heated to the desired temperature and pneumatic pressure member 206 lowered until edge portions of rigid backplate 210 engage the surface of the lamp. In some embodiments it may be desirable to apply additional heat through rigid backplate 210. Pneumatic pressure is applied to an inflation port 211 to expand elastomeric membrane 208 with sufficient force to deform lamp 204 within the concave portions of molding tool member 202. Heat is removed from molding tool member 202 and after a sufficient cooling period, the pneumatic pressure member is deflated and the thermalformed lamp removed from molding tool member 202.

It is recognized that in applications where the forming of an electroluminescent lamp does not require precisely defined edges, the lamp may be pressure formed under cooler pressure molding conditions. This, too, will maintain the operational integrity of the carrier substrate and the thermoplastic layers of the formed lamp. The embodiments described above in conjunction with FIGS. 11B, 12A, and 14C are examples of applications where pressure forming may be used to produce a formed shape capable of emitting light. On the other hand, for those embodiments requiring higher definition and more complex shapes (e.g., embossed alphanumeric symbols) thermalforming within the temperatures ranges described is preferable. The "C" clamp and pneumatic pressure producing arrangements described above in conjunction with FIGS. 11A and 16, respectively are both appropriate for pressure forming electroluminescent lamps.

Figure 8A:
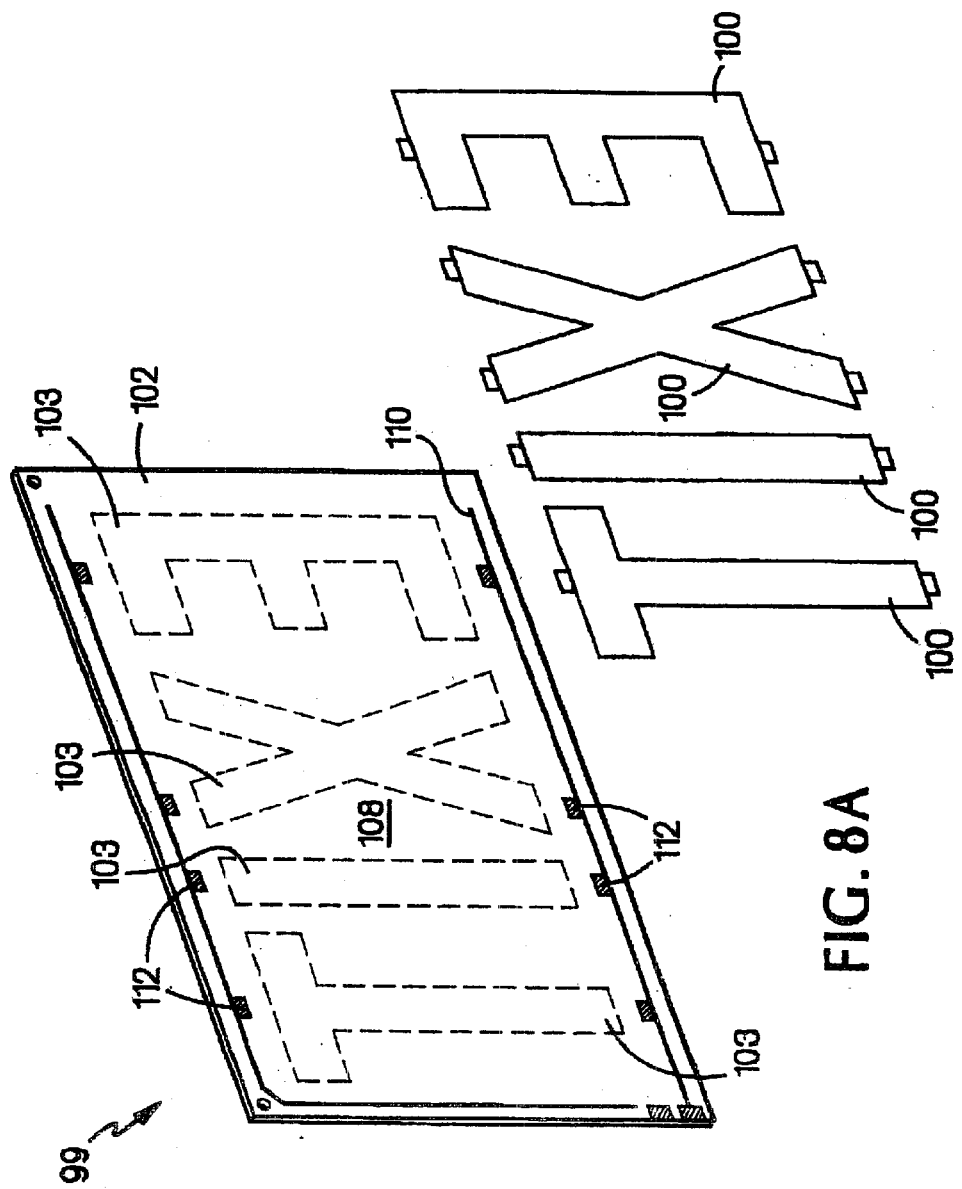
FIG. 8A is an exploded view of a sign having surface mounted lamps according to the invention.
Figure 8B:
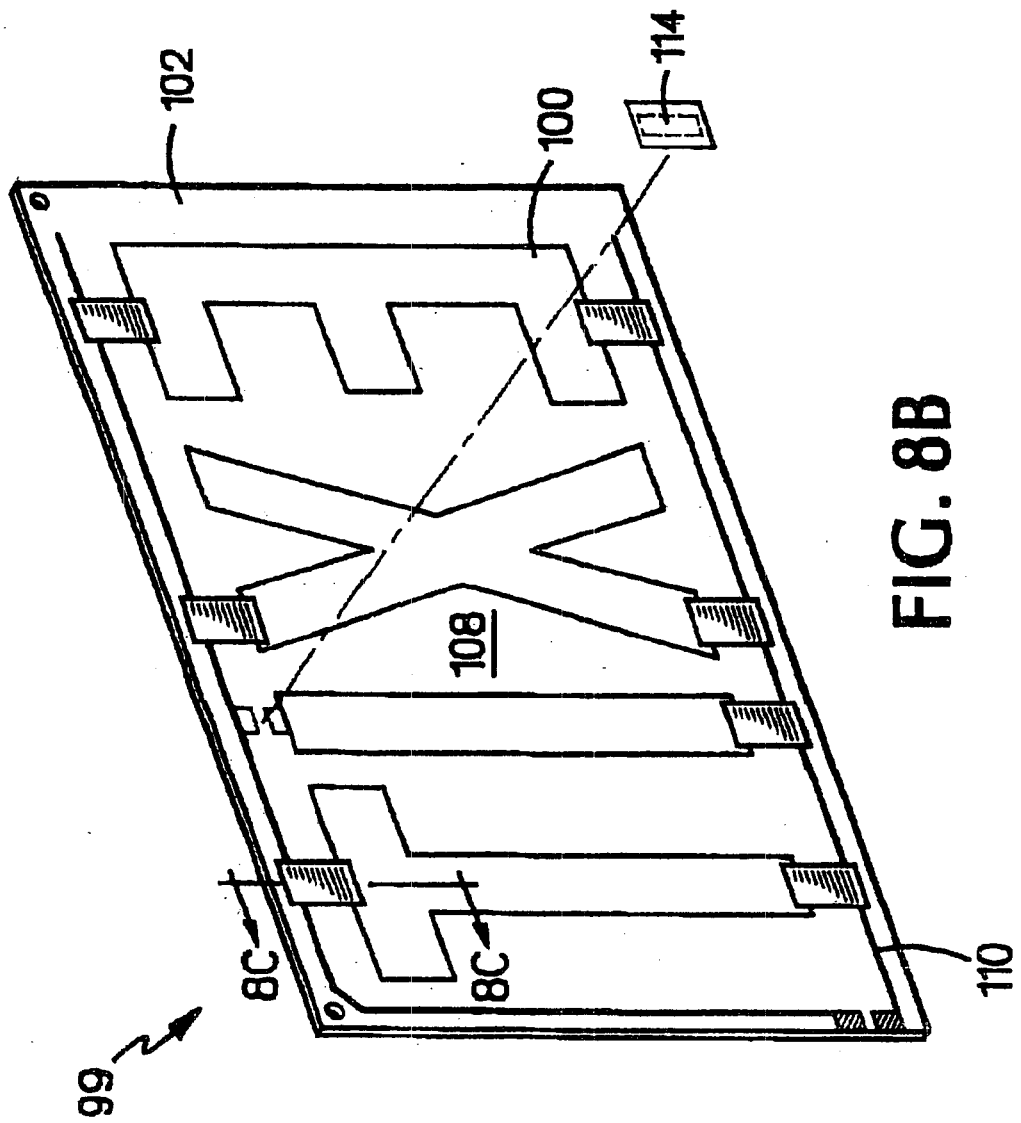
FIG. 8B is an assembled view of the sign of FIG. 8A.

Referring to FIGS. 8A–8C, electroluminescent lamps 100 are used to light a sign 99. A polycarbonate substrate 102 having a thickness of about 0.020 inches includes a graphic 104 on a front surface 106 with partially transparent areas 103 representing stenciled letters, for example, the word "EXIT". On an opposite rear surface 108 of substrate 102 conductive traces 110 for conveying power to lamps 100 are provided along the outer periphery of substrate 102 having connection pads 112 for attaching lamps 100. Lamps 100 are here fabricated using the process described above in conjunction with FIG. 2. However, because lamps 100 in sign 99 are not required to be flexible, rigid lamps may alternatively be employed, still using surface mount techniques, such as described above. Unlike the embodiments described above in conjunction with FIGS. 1 and 8, lit sides 113 of lamps 100 are placed face to face with rear surface 108 (ink side) of substrate 102 and held upon substrate 102 using a thin sheet of transparent adhesive 115 (FIG. 8C) so that the emitted light passes through transparent regions 103. Referring to FIGS. 8B and 8C, flexible polyester jumpers 114 having silver traces 116 on one surface are used to connect rear electrodes on unlit sides 118 of lamps 100 to connection pads 112 of substrate 102. Connection between lamps 100 and conductive traces 110 may be accomplished using any of the above described attachment methods described above in conjunction with FIGS. 3A–3E, 9, and 10.

What is claimed is:

1. A method of forming an electroluminescent lamp, comprising:
   providing a multi-layer, sheet form electroluminescent lamp including:
   a pair of sheet-form conductive layers, one of which is transparent for transmitting light,
   an electroluminescent sheet-form layer disposed between the pair of sheet-form conductive layers and having electroluminescent particles,
   a carrier substrate for supporting the pair of sheet-form conductive layers and electroluminescent sheet-form layer, the multi-layer, sheet-form having a first three-dimensional shape;
   heating the multi-layer, sheet-form electroluminescent lamp at a temperature sufficient for maintaining the operational integrity of said carrier substrate, said pair of sheet-form conductive layers, and said electroluminescent layers; and
   deforming the multi-layer, sheet-form electroluminescent lamp into a desired second three-dimensional shape, different than the first three-dimensional shape.

2. The method of claim 1 wherein the heating step includes heating the multi-layer, sheet-form electroluminescent lamp in a temperature range below the softening point temperature of the carrier substrate.

3. The method of claim 2 wherein the heating step includes heating the multi-layer, sheet-form electroluminescent lamp in a temperature range between 190° F. and 270° F.

4. The method of claim 2 wherein the heating step includes heating the multi-layer, sheet-form electroluminescent lamp in a temperature range between 230° F. and 260° F.

5. The method of claim 1 wherein the multi-layer, sheet-form electroluminescent lamp includes contact conductors.

6. The method of claim 5 further comprising deforming the contact conductors to provide spring detents.

7. The method of claim 6 wherein a first one of the conductors is deformed in a direction opposite to that of another of the conductors.

8. The method of claim 1 wherein the first three-dimensional shape is planar and the desired second three-dimensional shape is substantially non-planar.

9. A method of forming an electroluminescent lamp, comprising:
   providing a multi-layer, sheet form electroluminescent lamp including:
   a pair of sheet-form conductive layers, one of which is transparent for transmitting light,
   an electroluminescent sheet-form layer disposed between the pair of sheet-form conductive layers and having electroluminescent particles,
   a carrier substrate for supporting the pair of sheet-form conductive layers and electroluminescent sheet-form layer;
   heating the multi-layer, sheet-form electroluminescent lamp at a temperature sufficient for maintaining the operational integrity of said carrier substrate, said pair of sheet-form conductive layers, and said electroluminescent layers;
   deforming the multi-layer, sheet-form electroluminescent lamp into a desired three-dimensional shape, and wherein at least one of the conductive layers includes a fluoropolymer resin.

10. A method of forming an electroluminescent lamp, comprising:
    providing a multi-layer, sheet form electroluminescent lamp including:
    a pair of sheet-form conductive layers, one of which is transparent for transmitting light,
    an electroluminescent sheet-form layer disposed between the pair of sheet-form conductive layers and having electroluminescent particles,
    a carrier substrate for supporting the pair of sheet-form conductive layers and electroluminescent sheet-form layer;

heating the multi-layer, sheet-form electroluminescent lamp at a temperature sufficient for maintaining the operational integrity of said carrier substrate, said pair of sheet-form conductive layers, and said electroluminescent layers;

deforming the multi-layer, sheet-form electroluminescent lamp into a desired three-dimensional shape, and wherein the deforming step comprises applying pressure after heating of the multi-layer, sheet-form electroluminescent lamp.

11. A method of forming an electroluminescent lamp, comprising:

providing a multi-layer, sheet form electroluminescent lamp including:

a pair of sheet-form conductive layers, one of which is transparent for transmitting light, an electroluminescent sheet-form layer disposed between the pair of sheetform conductive layers and having electroluminescent particles, a carrier substrate for supporting the pair of sheet-form conductive layers and electroluminescent sheet-form layer;

heating the multi-layer, sheet-form electroluminescent lamp at a temperature sufficient for maintaining the operational integrity of said carrier substrate, said pair of sheet-form conductive layers, and said electroluminescent layers;

deforming the multi-layer, sheet-form electroluminescent lamp into a desired three-dimensional shape, and further comprising:

providing a die having a male member and a mating female member, which together define the desired three-dimensional shape;

heating at least one of the male member and female member of the die;

positioning the multi-layer, sheet-form electroluminescent lamp between the male member and female member of the die; and applying pressure to the male member and female member of the die.

12. The method of claim 11 further comprising providing a clamp for applying pressure to the male member and female member of the die.

13. A method of constructing a three dimensional illuminating object comprising, forming a multi-layer, sheet-form lamp member having a first three-dimensional shape by providing upon a generally sheet-form, light-transmitting thermoplastic carrier substrate an electroluminescent lamp comprised of a thin film transparent electrode deposited on said carrier substrate and, thereon, a plurality of intimately bonded superposed thermoplastic layers including a layer containing phosphor particles that forms a phosphor layer, an insulative layer and a back conductive electrode layer, placing said multi-layer, sheet-form lamp member over a die, and pressure forming said multi-layer, sheet-form lamp member by pressing said lamp member against said die to form said lamp member to a desired second three dimensional shape, different than the first three-dimensional shape, under conditions maintaining the operational integrity of said carrier substrate and said thermoplastic layers to produce a formed shape capable of emitting light.

14. The method of claim 13 wherein the first three-dimensional shape is planar and the desired second three-dimensional shape is substantially non-planar.

15. The method of claim 13 wherein said superposed thermoplastic layers are of coated or printed form.

16. The method of claim 15 wherein said carrier substrate is a biaxially oriented sheet.

17. The method of claim 15 wherein said carrier substrate is a polyester.

18. The method of claim 15 wherein said carrier substrate is a polycarbonate.

19. The method of claim 15 wherein said superposed thermoplastic layers are comprised of a fluoropolymer polymer resin.

20. The method of claim 15 wherein prior to pressure forming said lamp member, said lamp member is heated to a molding temperature below the softening point temperatures of the thermoplastic of the carrier substrate and of the thermoplastic of said superposed layers and thereafter said lamp member is cooled in said molded three-dimensional form.

21. The method of claim 20 wherein said molding temperature is below a temperature at which substantial shrinking of said carrier substrate occurs.

22. The method of claim 21 wherein said molding temperature is in the range between 190° F. and 270° F.

23. The method of claim 21 wherein said molding temperature is in the range between 230° F. and 260° F.

24. A three dimensional illuminating object provided by the method of claim 15.

25. The illuminating object of claim 24 in the form of a decorative embossed, self-illuminating figure.

26. The illuminating object of claim 24 in the form of an embossed, self-illuminating alphanumeric symbol.

27. The illuminating object of claim 24 in the form of a shaped pendant self-illuminating ornament.

28. The illuminating object of claim 24 in the forn of a shaped, self-illuminating identifying logo.

29. A method of constructing a three dimensional illuminating object comprising, forming a lamp member by providing upon a generally sheet-form biaxially oriented light-transmitting polyester carrier substrate an electroluminescent lamp comprised of a thin film transparent electrode deposited on said carrier substrate and a plurality of intimately bonded superposed polyvinylidene fluoride layers including a layer containing phosphor particles, a layer containing insulative particles and a layer containing conductive particles forming a back conductive electrode, heating said lamp member to a molding temperature in the range between 190° F. and 270° F. and molding said heated lamp member at said temperature to a desired three dimensional shape whereby shrinkage of said carrier substrate is avoided and the operational integrity of said polyester carrier substrate and said polyvinylidene layers is maintained, and cooling said lamp member in said three-dimensional molded form.

30. The method of claim 29 wherein said molding temperature is in the range between 230° F. and 260° F.

31. A method of producing an article comprising a three-dimensionally shaped, extended structural member having at least one illuminated area at a selected region smaller than said structural member, comprising fabricating said structural member with a three-dimensional receptor surface at said selected region, providing a three-dimensionally shaped lamp member cooperatively sized and shaped to match with said receptor surface, said lamp member being produced by the method according to claim 29, and joining said matching three dimensionally shaped lamp member to its respective receptor surface on said structural member.

32. A three dimensional illuminating object provided by the method of claim 24.

* * * * *